United States Patent
Wangler et al.

(10) Patent No.: US 6,583,937 B1
(45) Date of Patent: Jun. 24, 2003

(54) ILLUMINATING SYSTEM OF A MICROLITHOGRAPHIC PROJECTION EXPOSURE ARRANGEMENT

(75) Inventors: Johannes Wangler, Königsbronn (DE); Jess Köhler, Oberkochen (DE)

(73) Assignee: Carl-Zeiss Stiftung, Oberkochen (DE)

( * ) Notice: Subject to any disclaimer, the term of this patent is extended or adjusted under 35 U.S.C. 154(b) by 50 days.

(21) Appl. No.: 09/871,636

(22) Filed: Jun. 4, 2001

Related U.S. Application Data

(63) Continuation-in-part of application No. 09/449,415, filed on Nov. 29, 1999, now Pat. No. 6,243,206.

(30) Foreign Application Priority Data

Nov. 30, 1998 (DE) .......................................... 198 55 106
Aug. 18, 2000 (DE) .......................................... 100 40 898

(51) Int. Cl.[7] .......................... G02B 27/10; G03B 27/42; G03B 27/54; G03B 27/72
(52) U.S. Cl. .......................... 359/624; 359/621; 355/53; 355/67; 355/71
(58) Field of Search .......................... 359/621, 619, 359/291, 224, 623, 624; 355/53, 55, 67, 71; 250/492.1, 492.2, 398

(56) References Cited

U.S. PATENT DOCUMENTS

| | | | |
|---|---|---|---|
| 4,682,885 A | | 7/1987 | Torigoe .......................... 355/67 |
| 5,402,267 A | | 3/1995 | Fürter et al. .................. 359/727 |
| 5,594,526 A | * | 1/1997 | Mori et al. ..................... 355/67 |
| 5,594,587 A | * | 1/1997 | Komatsuda et al. ......... 359/619 |
| 5,754,278 A | * | 5/1998 | Kurtz ............................ 355/67 |
| 5,798,866 A | | 8/1998 | De Vaan ....................... 359/621 |
| 5,815,248 A | | 9/1998 | Nishi et al. .................... 355/71 |
| 5,844,727 A | * | 12/1998 | Partlo .......................... 355/67 |
| 5,847,746 A | | 12/1998 | Takahashi .................... 347/241 |
| 5,923,475 A | * | 7/1999 | Kurtz et al. ................. 359/619 |
| 5,926,257 A | | 7/1999 | Mizouchi ....................... 355/67 |
| 5,959,779 A | | 9/1999 | Yamazaki et al. .......... 359/624 |
| 5,963,305 A | | 10/1999 | Mizouchi ...................... 355/67 |
| 5,982,558 A | | 11/1999 | Fürter et al. ................. 359/649 |
| 6,061,179 A | | 5/2000 | Inoguchi et al. ............ 359/621 |
| 6,064,528 A | * | 5/2000 | Simpson, Jr. ............... 359/619 |
| 6,100,961 A | | 8/2000 | Shiraishi et al. .............. 355/67 |
| 6,259,510 B1 | * | 7/2001 | Suzuki .......................... 355/53 |
| 6,285,443 B1 | * | 9/2001 | Wangler et al. ............... 355/67 |

FOREIGN PATENT DOCUMENTS

DE 4441947 5/1996

OTHER PUBLICATIONS

"Cylindrical lens arrays homogenize excimer beam" by Y. A. Carts, Laser Focus World, Nov. 1991.

* cited by examiner

*Primary Examiner*—Georgia Epps
*Assistant Examiner*—Jack Dinh
(74) *Attorney, Agent, or Firm*—Walter Ottesen

(57) ABSTRACT

The invention relates to an illuminating system of a microlithographic projection exposure arrangement having a light source (1), a first objective (7), a fly-eye-integrator (11), a diaphragm plane (13), a condenser optic (15), and an image plane (21) having a field to be illuminated. The fly-eye-integrator (11) includes at least a first one-dimensional array (39) of first cylinder lenses having first cylinder axes and a second one-dimensional array (47) of second cylinder lenses having second cylinder axes. The second cylinder axes are aligned perpendicularly to the first cylinder axes. A third one-dimensional array (35) of third cylinder lenses having third cylinder axes are mounted forward of the first array (39) to increase divergence. The third cylinder axes are aligned parallelly to the first cylinder axes and a fourth one-dimensional array (43) of fourth cylinder lenses having fourth cylinder axes is arranged forward of the second array (47) for increasing divergence. The fourth cylinder axes are aligned parallel to the second cylinder axes.

35 Claims, 10 Drawing Sheets

ILLUMINATING SYSTEM OF A MICROLITHOGRAPHIC PROJECTION EXPOSURE ARRANGEMENT

RELATED APPLICATIONS

This application is a continuation-in-part application of patent application Ser. No. 09/449,415, filed Nov. 29, 1999 now U.S. Pat. No. 6,243,206, entitled "Illuminating System for Vacuum Ultraviolet Microlithography".

FIELD OF THE INVENTION

The invention relates to an illuminating system having a fly-eye-integrator for a microlithographic projection exposure arrangement. The invention also relates to a microlithographic projection exposure arrangement including an illuminating system having a fly-eye-integrator and a method for producing microstructured components with a microlithographic projection exposure arrangement including an illuminating system having a fly-eye-integrator.

BACKGROUND OF THE INVENTION

U.S. Pat. No. 4,682,885 discloses an illuminating system of the kind referred to above. The light of a mercury vapor lamp is received by an elliptical collector mirror and is directed onto an optical integrator which is configured as a special embodiment of a fly-eye-integrator. The optical integrator mixes light and generates a plurality of light beams which are superposed in an image plane by a condenser optic and there illuminate a rectangularly-shaped field. The optical integrator comprises two pairs of plates having cylinder lenses. The cylinder axes of the cylinder lenses of a pair are parallel and the cylinder axes of the pairs are directed perpendicularly to each other. The two plates of a pair are mounted in the mutually opposite focal plane of the cylinder lenses. A rectangularly-shaped field having a lateral aspect ratio of greater than 1:1 is illuminated in the image plane via focal lengths of the two pairs with the focal lengths being of different sizes.

U.S. Pat. No. 5,926,257 discloses an illuminating system having a fly-eye-integrator which has a configuration similar to the fly-eye-integrator disclosed in U.S. Pat. No. 4,682,885. The cylindrical lenses are configured as diffractive elements having a cylindrical effect.

U.S. Pat. No. 5,963,305 likewise discloses a fly-eye-integrator comprising two pairs of plates with cylindrical lenses wherein the pairs of plates are arranged perpendicularly to each other. Refractive and diffractive embodiments of the cylinder lenses are shown.

The fly-eye-integrators disclosed in U.S. Pat. Nos. 4,682,885; 5,926,257 and 5,963,305 have the disadvantage that the diaphragm plane of the illuminating system downstream of the fly-eye-integrator is only incompletely illuminated when the beam, which impinges on the fly-eye-integrator, has only a slight divergence. A beam of this kind is generated, for example, by a laser light source and is broken up into a plurality of beams by the crossed cylinder lens plates. These beams are focused in the diaphragm plane of the illuminating system and there form a lattice of secondary light sources. The secondary light sources are only point shaped because of the slight divergence of the beam at the entrance of the fly-eye-integrator. The diaphragm plane is therefore only illuminated with discrete intensity peaks. For the fly-eye-integrators having refractive cylinder lenses, the number of the illuminated cylinder lenses is in the order of magnitude of $10^1$. For this reason, only secondary light sources in the order of magnitude of $10^2$ are disposed in the diaphragm plane. With the use of diffractive elements having a cylindrical effect, the number of secondary light sources can be increased because of the lesser element width; however, very high requirements are imposed on the quality of the diffractive element and especially on the peripheral sharpness by the very large imaging scale between the diffractive elements and the field to be illuminated.

The two pairs of cylinder lens plates in U.S. Pat. Nos. 4,682,885; 5,926,257 and 5,963,305 have different focal lengths and the cylinder lens plates of a pair, which are arranged downstream in respective light paths, are mounted in the vicinity of the diaphragm plane. For this reason, the cylinder lens plates of the two pairs, which are mounted upstream each in respective light directions, are arranged axially separated. If the fly-eye-integrator is illuminated with a beam of finite divergence such as generated by a mercury vapor lamp, then the axial separation of the upstream-mounted cylinder lens plates leads to an elliptical illumination of the diaphragm plane. The illumination of the image plane should be as rotationally symmetrical as possible for use in microlithography. For this reason, the use of additional diaphragms or filters is required whereby a light loss occurs.

U.S. Pat. No. 5,847,746 discloses an illuminating system which utilizes two crossed cylinder lens plates of different focal length for mixing light. The cylinder lens plates are illuminated with a parallel light beam of slight divergence. To avoid the situation that the diaphragm plane of a downstream projection objective is illuminated pointwise by intensity peaks, the focal lengths of the two cylinder lens plates are so adjusted that the secondary light sources are split into meridional and sagittal secondary light sources which are arranged so as to be defocused. In this way, the intensity peaks in the diaphragm plane are pulled apart to lines of lesser maximum intensity. Disadvantageous in this arrangement is the only partial illumination of the diaphragm plane and the fact that the point symmetry of the diaphragm illumination, which is usually desired, is deteriorated by the line-shaped intensity peaks.

U.S. Pat. No. 5,815,248 shows the use of a one-dimensional lattice in front of a fly-eye-integrator. The fly-eye-integrator does not comprise individual plates having cylinder lenses but a plate having rod-shaped lens elements which are arranged in a two-dimensional array. The lens elements must have an equally sized lateral aspect ratio for a field having a high lateral aspect ratio which is to be illuminated. Correspondingly, the secondary light sources, which are generated by the lens elements in the diaphragm plane, are non-uniformly distributed without the one-dimensional grid. With the aid of the one-dimensional grid, the array having lens elements is illuminated from three directions lying in a plane so that the number of secondary light sources, which are generated by the array, is increased. In this way, a more uniform distribution of the secondary light sources is obtained in the diaphragm plane which follows the fly-eye-integrator. The disadvantage of the use of a one-dimensional grid is the fact that the illumination of the diaphragm plane comprises discrete intensity peaks and no homogeneous illumination is achieved. In addition, the optical channels, which are generated by the lens elements, have a high lateral aspect ratio so that a large portion of the light channels is only partially illuminated in the conventional circular-shaped illumination of the fly-eye-integrator.

SUMMARY OF THE INVENTION

It is an object of the invention to provide an illuminating system for vacuum ultraviolet microlithography which operates in the vacuum ultraviolet range.

A first embodiment of the invention is an illuminating system for vacuum-ultraviolet (VUV) microlithography with a fly-eye-integrator as an optical integrator. A microlens array having rectangular-shaped individual lenses is mounted ahead of the fly-eye-integrator for increasing divergence. The fly-eye-integrator comprises two fly-eye-plates mounted in mutually opposite focal planes and these fly-eye-plates are formed from an array of individual lenses or from two crossed cylinder lens plates. The optical channels have a similar lateral aspect ratio as the field to be illuminated. The optical channels are formed by the individual lenses or the crossed cylindrical lenses. In order to be able to uniformly illuminate the diaphragm plane, the rectangular-shaped microlenses must have a similar lateral aspect ratio as the optical channels in order to increase divergence.

With this embodiment, it is disadvantageous that, for a field having a high lateral aspect ratio, the individual lenses likewise have to exhibit a high lateral aspect ratio. Such individual lenses are complex to produce. If one utilizes crossed cylindrical lens plates for the fly-eye plates, then the width of the cylinder lenses differs greatly for the two alignments when the crossed cylinder lenses have the same focal length. For cylinder lens plates of different alignment, various production methods must be applied under certain circumstances. In this configuration too, a large portion of the light channels is only incompletely illuminated with the conventional circular illumination of the fly-eye-integrator.

It is another object of the invention to provide an illuminating system having a fly-eye-integrator for a microlithographic projection exposure arrangement. It is a further object of the invention to provide such an illuminating system wherein the diaphragm plane can be illuminated symmetrically and as completely as possible at high efficiency.

The illuminating system of the invention is for a microlithographic projection exposure arrangement and includes: a light source; a first objective defining an optical axis; a fly-eye-integrator mounted on the axis and being illuminated by the first objective with light from the light source to form a plurality of beams; the fly-eye-integrator including a first one-dimensional array of first cylinder lenses having respective first cylinder axes; a second one-dimensional array of second cylinder lenses having respective second cylinder axes orientated perpendicularly to the first cylinder axes; a third one-dimensional array of third cylinder lenses having respective third cylinder axes orientated parallel to the first cylinder axes; and, a fourth one-dimensional array of fourth cylinder lenses having respective fourth cylinder axes orientated parallel to the second cylinder axes; the third one-dimensional array being configured for increasing divergence and being disposed upstream of the first one-dimensional array; and, the fourth one-dimensional array being configured for increasing divergence and being mounted on the optical axis upstream of the second one-dimensional array; a diaphragm plane on the optical axis directly downstream of the fly-eye-integrator; and, a condenser optic for superposing the plurality of beams into an image plane to illuminate a field.

In the illuminating system of the above embodiment, the rays, which emanate from a light source, are received by a first objective and form a beam in the exit plane of the first objective. This beam is preferably of parallel rays of low divergence. A fly-eye-integrator generates from this beam a plurality of beams which are superposed by a condenser optic in an image plane of the illuminating system and there preferably illuminate a rectangularly-shaped field. The longer field side is in the x-direction and the shorter side of the field is directed in the y-direction. The reticle for the microlithographic projection exposure arrangement or a masking arrangement, which is imaged by a downstream objective on the reticle, is imaged in the image plane of the illuminating system. The fly-eye-integrator includes at least a first plate and a second plate having rod-shaped cylinder lenses which are disposed in series perpendicular to the direction of the cylinder axes of the cylinder lenses. The cylinder lenses preferably have a cylindrical forward surface and a planar rearward surface. The cylindrical forward surface has a convex cross section perpendicular to the cylinder axis and a planar cross section parallel to the cylinder axis. The cylinder axes of the cylinder lenses of the two plates are preferably aligned perpendicular to each other. The cylinder axes of the cylinder lenses of the first plate are aligned in the x-direction. For this reason, the cylinder lenses of the first plate are identified in the following as y-field raster elements. The cylinder axes of the cylinder lenses of the second plate are aligned in the y-direction. For this reason, the cylinder lenses of the second plate are identified in the following as x-field raster elements. The y-field raster elements and the x-field raster elements generate a grid of secondary light sources in the diaphragm plane following the fly-eye-integrator. If the beam, which impinges on the fly-eye-integrator, exhibits a low divergence of the beam angles, then the expansion of the secondary light sources is low and the diaphragm plane is non-uniformly illuminated with discrete intensity peaks. In order to achieve a uniform illumination of the diaphragm plane, it is advantageous to mount a third plate forward of the plate having the y-field raster element viewed in the direction of the light with this third plate having rod-shaped cylinder lenses and to mount a fourth plate forward of the plate having x-field raster elements viewed in light direction with the fourth plate also having rod-shaped cylinder lenses. The cylinder lenses of the third plate are, in the direction of the cylinder axes, of the same length as the y-field raster elements but have a lesser width perpendicular to the direction of the cylinder axis than the y-field raster elements. These cylinder lenses are referred to in the following as y-microcylinder lenses. The cylinder axes of the y-microcylinder lenses are aligned parallel to the axes of the y-field raster elements. The cylinder lenses of the fourth plate are, in the direction of the cylinder axes, of the same length as the x-field raster elements but have, perpendicular to the direction of the cylinder axes, a lesser width than the x-field raster elements. The cylinder lenses are referred to in the following as x-microcylinder lenses. The cylinder axes of the x-microcylinder lenses are aligned parallel to the axes of the x-field raster elements. The microcylinder lenses, which are arranged forward of the field raster elements, lead to an increase of the divergence of the beam impinging on the field raster elements. In this way, the expansion of the secondary light sources is increased in the diaphragm plane and therefore the diaphragm plane is more uniformly illuminated. The advantage of the use of two plates mounted forward of the respective field raster elements and having microcylinder lenses is that the increase of divergence occurs in each case directly ahead of the field raster elements and only in one plane. The surface normal of these planes point in the direction of the cylinder axes of the microcylinder lenses and the corresponding field raster elements. The microcylinder lenses are configured to be refractive or diffractive.

It is advantageous when the x-field raster elements and the y-field raster elements have similar widths perpendicular to the respective cylinder axes. Preferably, the widths of the x-field raster elements and the y-field raster elements are the same size in the context of the manufacturing tolerances. In this way, the same manufacturing method can be applied for the x-field raster element and the y-field raster element. A further advantage of equal width x-field and y-field raster elements is that the secondary light sources in the diaphragm plane come to lie on a quadratic grid. In order to illuminate a rectangularly-shaped field for like widths for the x-field and y-field raster elements, the x-field and y-field raster elements have to have different focal lengths. Since the field raster elements are cylinder lenses, the input of a focal length for the field raster elements refers to the surface section in which the field raster elements exhibit an optical effect. The shorter field side in the image plane of the illuminating system points in the y-direction. For this reason, the focal length of the y-field raster element has to be greater than the focal length of the x-field raster element and preferably greater than 1.5 times and especially greater than by a factor of 2.

Preferably, the angle distribution of the rays, which impinge upon the field raster element, should be homogeneous at each position of the field raster element. This is not possible because the microcylinder lenses are discrete elements. In order to nonetheless illuminate the field raster element with an angle distribution as independent of position as possible it is advantageous when the width of the microcylinder lenses is less than the width of the corresponding field raster element. Advantageously, the width of the microcylinder lenses is less than half of the width of the corresponding field raster elements and is preferably less than ⅕ of the width of the corresponding field raster elements.

The secondary light sources generated by the field raster elements in the diaphragm plane are not homogeneously illuminated but exhibit intensity fluctuations because of the rastering of the microcylinder lenses. The number of intensity peaks within one secondary light source in one direction corresponds to the number of microcylinder lenses per field raster element. If the number of x-microcylinder lenses per x-field raster element is the same as the number of y-microcylinder lenses per y-field raster element, then the secondary light sources have equally as many intensity peaks in the x and y directions.

The expansion of the secondary light sources in the diaphragm plane is determined by the maximum angle with respect to the optical axis of the rays, which impinge upon the field raster elements, and by the spacing of the field raster elements from the diaphragm plane. This spacing corresponds approximately to the focal length of the field raster elements. The maximum angle is, in turn, fixed by the width and the focal length of the microcylinder lenses. The focal length of the microcylinder lenses refers to the area section wherein the microcylinder lenses have an optical effect. The maximum angle must be limited upwardly so that the individual secondary light sources do not overlap. These light sources are at a spacing in the diaphragm plane corresponding to the width of the field raster elements. Therefore, the ratio of width and focal length of the microcylinder lenses is preferably selected to be less than the ratio of width and focal length of the corresponding field raster elements.

On the other hand, the diaphragm plane should be illuminated as homogeneously as possible. For this reason, the maximum angle of the rays, which impinge upon the field raster element, should have a minimum value with respect to the optical axis. It is advantageous when the expansion of the secondary light sources corresponds at least to half the spacing of the secondary light sources. This is the case when the ratio of width and focal length of the microcylinder lenses amounts to at least half of the ratio of width and focal length of the corresponding field raster element.

Reflection losses occur at each boundary surface between materials of different refractive indexes. For this reason, the number of the boundary surfaces should be held as low as possible. Especially at wavelengths below 200 mm, it is an object to hold the number of optical elements as low as possible. It is therefore especially advantageous to join the plate with the y-microcylinder lenses and the plate with the corresponding y-field raster elements and/or the plate having the x-microcylinder lenses and the plate having the corresponding x-field raster elements each to a plate structured on the forward and rear surfaces. The joining can be achieved, for example, by wringing or via a cement area. Likewise, the simultaneous structuring of the forward and rearward surfaces of a plate is possible. In this way, two boundary surfaces are rendered unnecessary for each microcylinder lens field raster element plate built as one piece.

It is advantageous when the diaphragm plane is freely accessible in order to install diaphragm devices or control devices for measuring purposes in the diaphragm plane. The free working spacing should be at least 1.0 mm in the light direction upstream of the diaphragm plane. Preferably, this free work spacing should be at least 1.5 mm. The free work spacing downstream of the diaphragm plane should be at least 1 mm and preferably 3 mm.

The illumination of the diaphragm plane with diaphragm devices therein and therefore also the pupil illumination should be controllable. Conventional diaphragm devices have a circular opening for a so-called conventional pupil illumination or two openings for a so-called dipole pupil illumination with the openings being arranged point symmetrical to the diaphragm center or four openings for a so-called quadrupole pupil illumination with these four openings being arranged point symmetrically to the diaphragm center.

Individual field raster elements can be entirely or partially masked with additional diaphragm devices directly forward or rearward of the field raster elements. In this way, it is possible that only the regions of the field raster elements participate in the illumination of the diaphragm plane which regions are illuminated over their entire width. This leads to an increased uniformity of the illumination of the image plane of the illuminating system.

It is advantageous when the fly-eye-integrator has a plate having a two-dimensional arrangement of toric lenses in order to be able to image the x-field raster elements and the y-field raster elements with edge sharpness in the image plane of the illuminating system for expanded secondary light sources. Each toric lens together with a y-field raster element and an x-field raster element conjointly forms an optical channel. The optical channel includes not the total y-field raster element and x-field raster element but only the region of the field raster elements which results for an imaginary projection in the light direction as an intersection of the two y-field and x-field raster elements with the toric lens with these field raster elements being arranged so as to be crossed. In its center, the optical channel has a linear axis parallel to the optical axis of the fly-eye-integrator. The y-field raster element, x-field raster element and toric lens are arranged on this linear axis and the axis intersects the toric lens in the surface vertex. Corresponding to the widths of the field raster elements, the optical channels are delimited rectangularly and for the same field raster element width are limited quadratically. The two primary axes of the toric lenses are so aligned that the one primary axis runs parallel to the cylinder axes of the y-field raster elements and the other primary axis runs parallel to the cylinder axes of the x-field raster elements.

It is advantageous to so design the optical effects of the y-field raster element, x-field raster element and toric lenses that the back focal points of the optical channels lie in the proximity of the diaphragm plane. The optical channels are formed from a y-field raster element, an x-field raster element and a toric lens. In this way, a parallel beam, which impinges on the fly-eye-integrator, is first broken down into a plurality of beams and these beams are focused in the diaphragm plane or in the vicinity thereof whereby the secondary light sources are generated there.

The use of cylinder lenses or of toric lenses indicates the view in two mutually perpendicular planes. One plane has a surface normal pointing in the direction of the cylinder axes of the y-field raster elements of an optical channel and includes the axis of the viewed optical channel. This plane is referred to in the following as meridional plane. Optical quantities such as focal point and focal length for a viewed optical channel are given the attribute "meridional" when they are determined by rays which run exclusively in the meridional plane. A plane whose surface normal points in the direction of the cylinder axes of the x-field raster elements of an optical channel and which includes the axis of the viewed optical channel is referred to in the following as the "sagittal plane". Optical quantities such as focal point and focal length for a viewed optical channel are given the attribute "sagittal" when they are determined by rays which run exclusively in the sagittal plane.

In the determination of optical quantities for the optical channels, the microcylinder lenses are considered only with their center thickness as planar plates without their cylinder effect. The determination of the focal length or of the focal point of an optical channel therefore includes the y-microcylinder lenses and the x-microcylinder lenses considered as a planar plate. The influence of these equivalent planar plates on the focal lengths and focal points is, however, low.

It is advantageous to design the optical effects of the y-field raster elements and of the section of the toric lenses in the y-direction in such a manner that the meridional front focal points are located at the position of the y-field raster elements. The back focal point of the condenser optic, which follows the diaphragm plane, is located in the image plane of the illuminating system. For this reason, an optically conjugated arrangement of y-field raster elements and image plane results in the meridional section. The y-field raster elements are therefore imaged in the image plane. At the same time, it is advantageous if the optical effects of the x-field raster elements and of the section of the toric lenses, which points in the x-direction, are so designed that the sagittal front focal points are located at the position of the x-field raster elements. In this way, the x-field raster elements are likewise imaged in the image plane. The field in the image plane, which is to be illuminated, is delimited sharply at the edges by this measure. In addition, a very homogeneous illumination of the field is achieved by the superposition of the plurality of beams. The toric lenses contribute the largest portion of the optical effect for imaging of the field and are arranged in the proximity of the diaphragm plane. For this reason, the toric lenses are referred to in the following as pupil raster elements.

In lieu of the plate having a two-dimensional arrangement of toric lenses, the fly-eye-integrator can have a further plate having cylinder lenses whose cylindrical axes are aligned parallel to the cylinder axes of the x-field raster elements. This is especially the case for a microlithographic projection exposure arrangement designed as a scanner. These cylinder lenses are referred to in the following as x-pupil raster elements. The x-pupil raster elements preferably have a planar surface and a cylindrical surface. The cylindrical surface has a convex cross section perpendicular to the cylinder axis and a planar cross section parallel to the cylinder axis. The cylindrical surface is facing toward the diaphragm plane. Each x-pupil raster element together with a y-field raster element and an x-field raster element conjointly define an optical channel. The optical channel does not include the entire y-field raster element, x-field raster element and x-pupil raster element, but only the region of the field raster elements and of the x-pupil raster element which results with an imaginary projection in the light direction as an intersection of the y-field and the x-field raster elements arranged so as to be crossed with respect to each other and the x-pupil raster element. In its center, the optical channel has a linear axis running parallel to the optical axis of the fly-eye-integrator, with the y-field raster element, x-field raster element and x-pupil raster element being arranged on this linear axis. So that the secondary light sources can come to lie in the diaphragm plane or in the proximity thereof, it is advantageous when the back focal points of the optical channels are located there.

It is furthermore advantageous when the optical effect of the x-field raster elements and the x-pupil raster elements is so designed that the sagittal front focal points are located at the position of the x-field raster elements. The x-pupil raster elements and the condenser optic, which follows the diaphragm plane, then image the x-field raster elements in the image plane with high edge sharpness in the sagittal section.

To provide that the centroid rays of the beams run virtually parallel to the optical axis in the image plane of the illuminating system, it is advantageous to so configure the optical effect of the y-field raster elements that the spacing between the diaphragm plane and the back meridional focal points is approximately equal to half the meridional focal length.

Fly-eye-integrators which have only x-pupil raster elements in addition to the y-field raster elements and the x-field raster elements can be advantageously utilized in microlithographic projection exposure arrangements configured as a scanner. In these systems, only the short field end of the field, which is to be illuminated and which runs in the scan direction, has to be delimited with sharp edges. In the scan direction (that is, in the y-direction), a gradual increase of the intensity in pulsed light sources, such as laser light sources, is even advantageous in order to reduce pulse-quantization effects.

For an edge-like boundary of the illuminated field also in the y-direction, it is advantageous when the fly-eye-integrator has an additional plate with cylinder lenses in addition to the plate with the x-pupil raster elements. The cylindrical axes of the cylinder lenses are aligned parallel to the cylinder axes of the y-field raster elements. These cylinder lenses are characterized in the following as y-pupil raster elements. The y-pupil raster elements preferably have a planar and a cylindrical surface. The cylindrical surface includes a convex cross section perpendicular to the cylinder axis and a planar cross section parallel to the cylinder axis. The cylindrical surface is preferably facing toward the diaphragm plane.

Each y-pupil raster element together with an x-pupil raster element, an x-field raster element and a y-field raster element forms an optical channel. The optical channel does not include the entire y-pupil raster element, x-pupil raster element, x-field raster element and y-field raster element, but only the region of the field raster elements and the pupil raster elements which results for an imaginary projection in the light direction as an intersection of the selected field and pupil raster elements. In its center, the optical channel includes a linear axis running parallel to the optical axis of the fly-eye-integrator and the y-field raster element, x-field raster element, x-pupil raster element and y-pupil raster element are arranged on this linear axis. So that the secondary light sources come to lie in the diaphragm plane or in the proximity thereof, it is advantageous when the back focal points of the optical channels are located there.

To delimit the illuminated field with sharp edges in the image plane of the illuminating system, it is advantageous when the front meridional focal points of the optical channels are located at the location of the y-field raster elements and the front sagittal focal points of the optical channels are located at the location of the x-field raster elements.

In a similar manner as with the fly-eye-integrator having the pupil raster elements formed of toric lenses, it is advantageous when the y-field raster elements, the x-field raster elements, the x-pupil raster elements and the y-pupil raster elements all have the same widths. The optical channels are then quadratically limited and the secondary light sources lie in the reticle plane on a quadratic grid.

The pupil raster elements are arranged at a finite spacing to the diaphragm plane so that the diaphragm plane is accessible. This leads to unilluminated regions between the secondary light sources even when the pupil raster elements are illuminated to the edge of each optical channel with the aid of the x-microcylinder lenses and the y-microcylinder lenses. The unilluminated regions form unilluminated strips parallel to the cylinder axes of the x-field raster elements and the y-field raster elements. The unilluminated strips in the x-direction are arranged at a spacing of the width of the y-field raster elements and the unilluminated strips in the y-direction are arranged at a spacing of the width of the x-field raster elements. The widths of the unilluminated strips are less than 20% of the spacing of the adjacent unilluminated strips in order to illuminate the diaphragm plane as completely as possible.

It is further advantageous to select the widths of these unilluminated strips to be the same size independently of whether they are orientated in the direction of the cylinder axes of the y-field raster elements or of the x-field raster elements. In addition to an illumination of the diaphragm plane which is point symmetrical to the diaphragm center, one achieves in this way that two sectors can be illuminated with the same integral intensity with the two sectors being transposable into each other by mirroring on the x-axis and/or on the y-axis. In this way, each quadrant, which is delimited by the x-axis and y-axis, or each quadrant, which is delimited by two lines lying at an angle of 45° to the x-axis and y-axis, has the same integral intensity. In this case, the diaphragm plane is illuminated mirror symmetrically to the x-axis and y-axis. Structures of the downstream reticle which are perpendicular to each other are imaged on the wafer with the same quality by the diaphragm plane illuminated in this way.

To reduce the reflection losses at boundary surfaces, it is advantageous to join the x-pupil raster elements and the y-pupil raster elements or to build these raster elements as a plate structured on both sides.

An illuminating system with a fly-eye-integrator described herein can be especially well used in a microlithographic projection exposure arrangement. The reticle is then mounted in the image plane or in a plane of the illuminating system conjugated to the image plane with the reticle having the structures which are to be imaged. In order to vary the size of the region to be illuminated on the reticle, it is advantageous when a masking device is arranged in the image plane of the illuminating system with this masking device being imaged on the reticle via an objective. A projection objective follows the reticle and this projection objective images the structures of the reticle on a light-sensitive object such as a wafer. Projection objectives of this kind are disclosed, for example, in U.S. Pat. No. 5,402,267 incorporated herein by reference.

Microstructured components having structures smaller than 500 nm (preferably less than 200 nm) can be produced with a microlithographic projection exposure arrangement configured in this manner.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
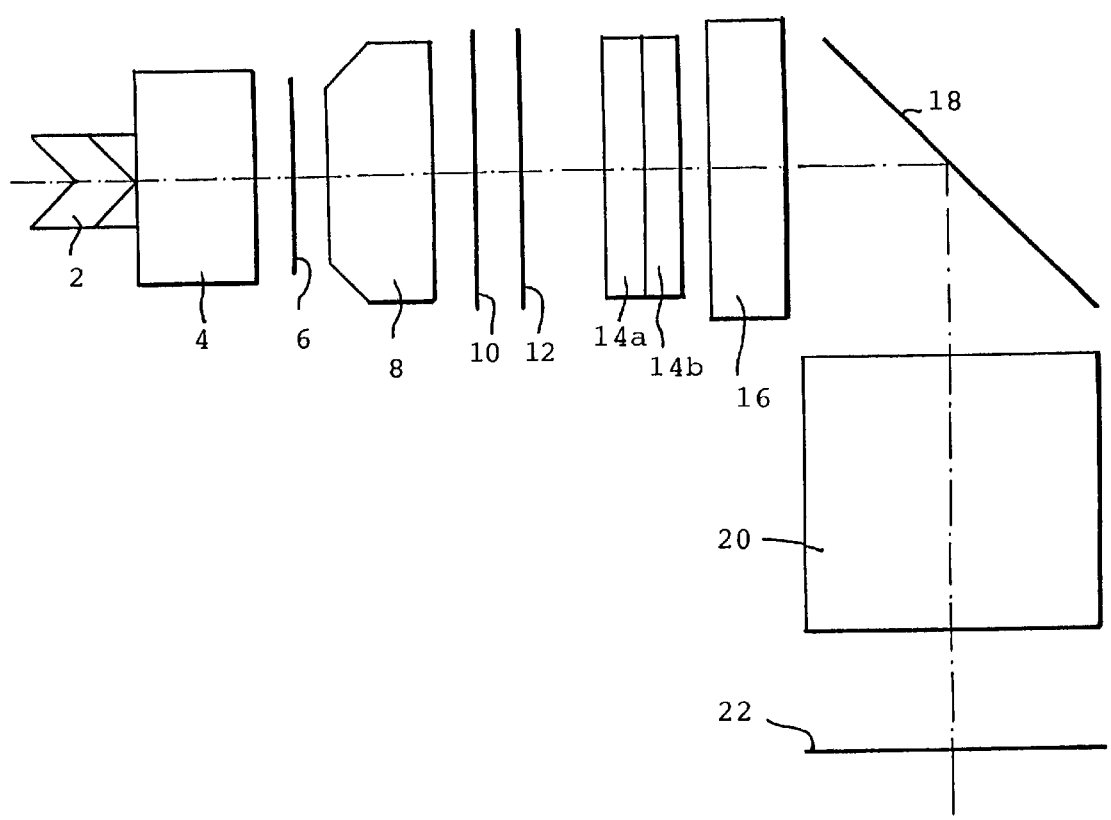
FIG. 1 shows an embodiment of an illuminating system according to the invention.

In FIG. 1, reference numeral 2 identifies a vacuum ultraviolet (VUV) excimer laser, that is, especially an $F_2$ laser having a 157 nm wavelength. The beam transmission and expansion system 4 supplies light to the projection illuminating apparatus and adapts the beam cross section to the requirement. The light conducting value (also Etendu-invariant or Lagrange-invariant) is, however, minimal because of the low divergence of the laser 2 (approximately 1 mrad) and is far from adequate for filling (illuminating) the required aperture of a projection objective with a suitable illuminating field.

Two microlens arrays 6 and 10 are preferably of $CaF_2$ and introduce an increased light conducting value. An intermediately mounted zoom objective 8 makes possible the adaptation of the degree of coherence σ (or the pupil fill). In a manner known per se, an adjustable axicon can be integrated into the zoom objective 8, which, inter alia, makes possible a variable annular aperture illumination.

The second microlens array 10 preferably has individual elements all having the same shape and having a similar aspect ratio as a reticle mask or as the object field and image field of the projection objective which is provided. The individual elements have especially a rectangular form.

Element 12 is a diffusing screen provided as an option and has a diffuse scattering. The element 12 can, for example, be an etched $CaF_2$ disc for improving the light conducting value and homogeneity.

Elements 14a and 14b are the two lens rasters of a fly-eye-integrator. The elements 14a and 14b can, for example, be configured as a microlens array as sold, for example, by Teledyne Brown Engineering, of Huntsville, Ala. Or, the elements 14a and 14b can comprise a pair of crossed cylinder stacks as described, for example, in the article of Y. A. Carts entitled "Cylindrical Lens Arrays Homogenize Excimer Beams" in the journal "Laser Focus World", November 1991, page 39. The number of the raster elements is, however, increased by one or more orders of magnitude. For example, a cross section of 4×4 $cm^2$ is provided having rod lenses of 1 mm thickness, that is, in the order of magnitude of $10^2$ to $10^3$ and more rod lenses, that is, array elements of one more order of magnitude. The two lens rasters (14a, 14b) are arranged in the mutually opposite focal planes in a fly-eye-integrator and this is different from that described in the article above by Y. A. Carts. $CaF_2$ or another fluoride is provided as a material. The diameter of the fly-eye-integrator extends up to approximately 100 mm.

Relay optics 16, a planar deflecting mirror 18 and field lens optics 20 are mounted downstream of the two lens rasters (14a, 14b) as shown. Preferably, aspheric lenses are provided therein in order to hold the number of lenses low and the total glass thickness low.

The large number of elements of the honeycomb condenser (14a, 14b), that is, the fine mastering, ensures a uniform function over the entire field in each direction when the pupil is varied. Compared to known arrays with approximately 10 elements, uniformity and stability is increased by far.

The technology of the diffractive optic (DOE), the binary optic and the zone plates (Fresnel lenses) are very well suited to configure the light-conductance value increasing elements (6, 10) as well as the lens arrays of the honeycomb condensers (14a, 14b).

This system has united all the required functional elements for an illuminating system for microlithography in a way which ensures an adequate transmission even in the VUV range, for example, at 157 nm. Especially zoom objective 8 including the axicon, relay 16 and field lens 20 can contain mirrors, preferably as catadioptric systems. In addition to $CaF_2$, another material such as a fluoride (for example, $BaF_2$, $SrF_2$, NaF, LiF) can be used for the transmitting optical elements.

Figure 2A:
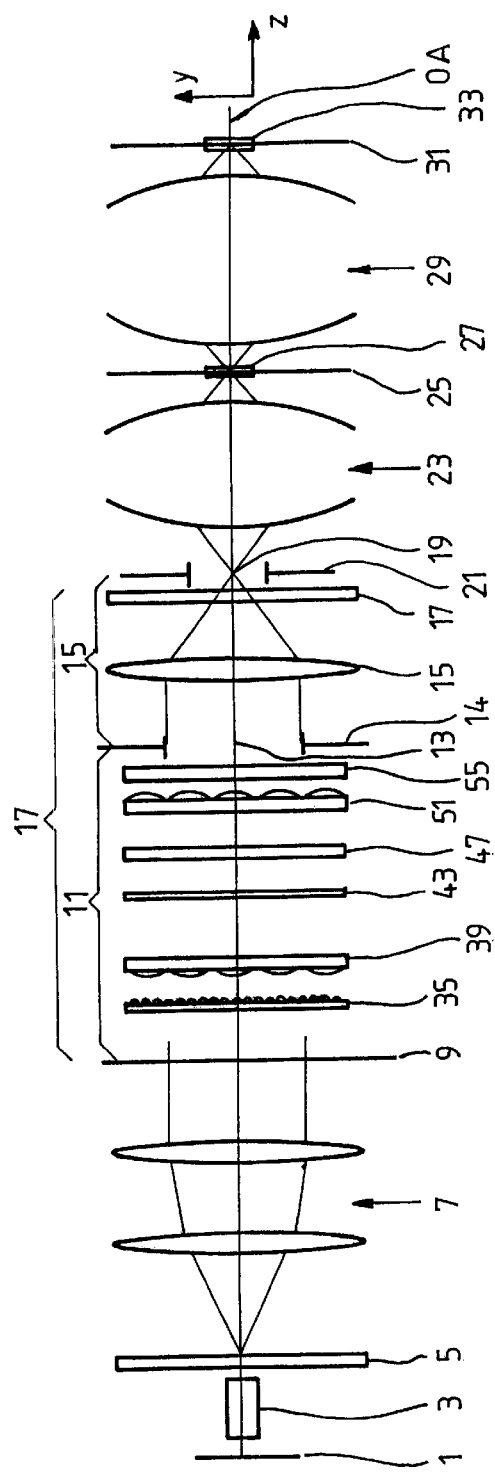
FIGS. 2a and 2b are schematics of an illuminating system according to another embodiment of the invention which includes a first embodiment for a fly-eye-integrator field lens module.
Figure 2B:
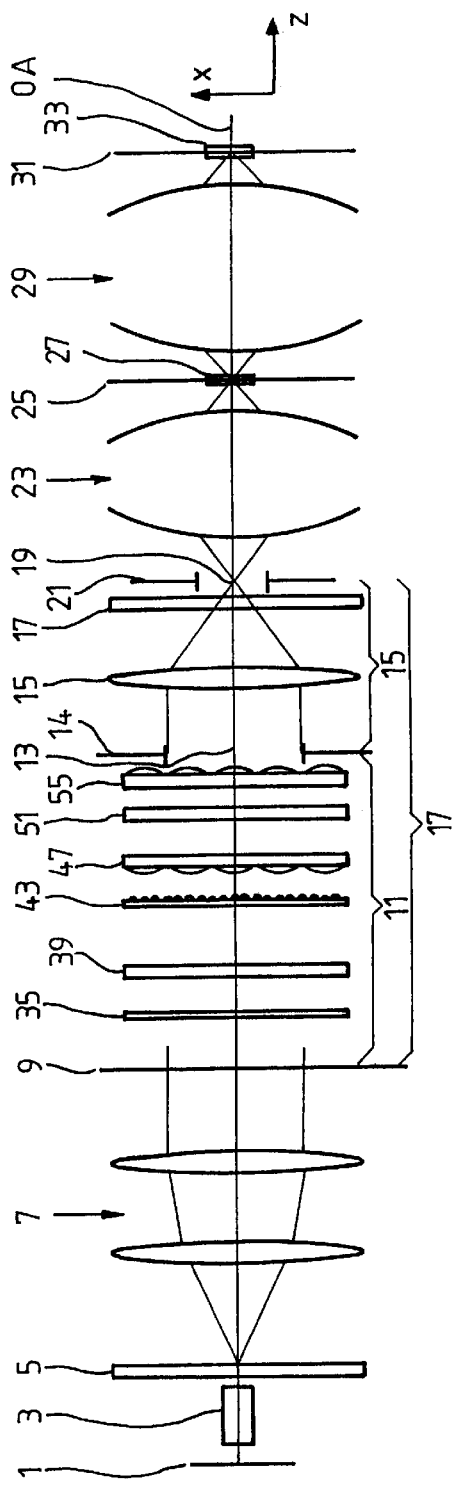

FIGS. 2a and 2b show a schematic representation of a microlithographic projection exposure arrangement extending from the light source 1 to the wafer 33. FIG. 2a shows a side elevation view (y-z section) and FIG. 2b shows a plan view (x-y section) of the arrangement shown in FIG. 2a.

For the light source 1, a DUV laser or a VUV laser can be used such as an ArF laser at 193 nm, a $F_2$ laser at 157 nm, an $Ar_2$ laser for 126 nm and a NeF laser for 109 nm. Other lasers can also be used. A parallel light beam is generated by a beam forming optic 3 and this beam impinges upon a divergence increasing optical element 5. For example, a raster plate of diffractive or refractive raster elements can be used as the divergence increasing optical element 5. Each raster element generates a beam whose angle distribution is determined by expansion and focal length of the raster element. The raster plate is disposed in the object plane of a downstream objective 7 or in the vicinity thereof. In the diaphragm plane 9 of the objective 7, the beams, which are generated by the raster elements, are superposed and illuminate the diaphragm plane 9 of the objective 7. The objective 7 can be designed as a zoom objective in order to vary the expansion of the illumination of the diaphragm plane 9. With the use of two axicon lenses directly forward of the diaphragm plane 9, an annular illumination having variable ring width can also be achieved. The axicon lenses are displaceable along the optical axis. One such zoom axicon objective is disclosed in German patent publication DE 44 41 947 A. The illumination can likewise be varied by exchanging the aperture generating element 5. Special aperture generating elements 5 also permit the so-called quadrupole illumination with four separate regions. The diaphragm plane 9 of the objective 7 is the entry plane of a fly-eye-integrator 11. A diaphragm plane 13 of the entire illuminating system is located in the vicinity of the exit plane of the fly-eye-integrator 11. The illumination of the diaphragm in the diaphragm plane 13 can be controlled via masks 14 or via transmission filters. A condenser optic 15 (the so-called field lens 15) follows the fly-eye-integrator 11. The optical system comprising fly-eye-integrator 11 and field lens 15 is referred to in the following as fly-eye-integrator field lens module 17.

Figure 3A:
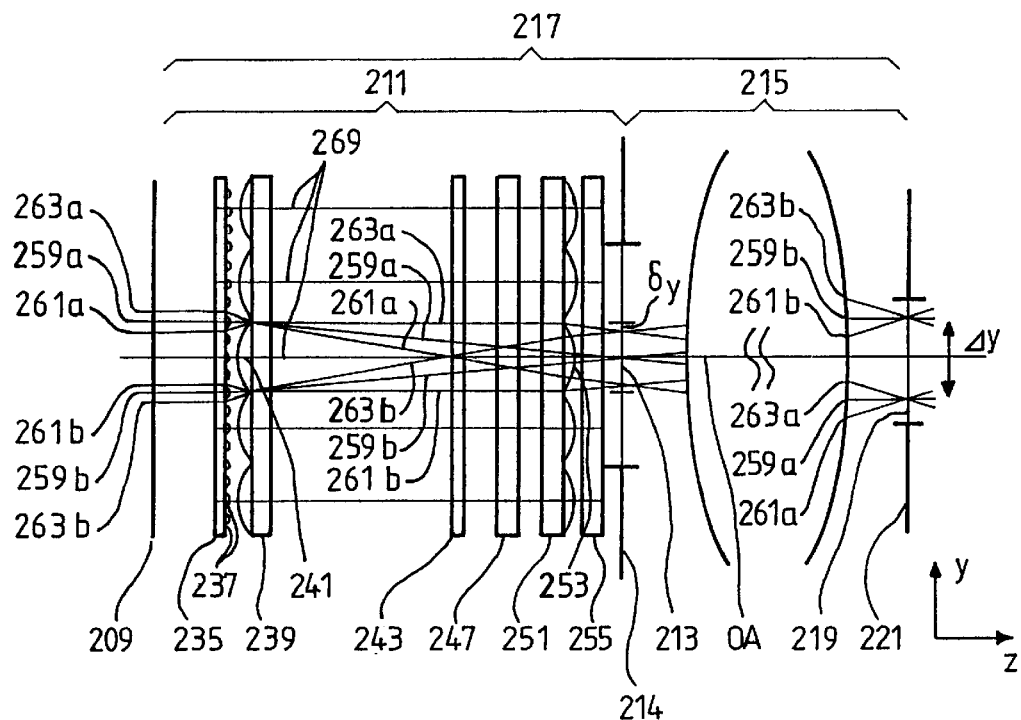
FIGS. 3a and 3b are schematics showing an embodiment of a fly-eye-integrator field lens module.
Figure 3B:
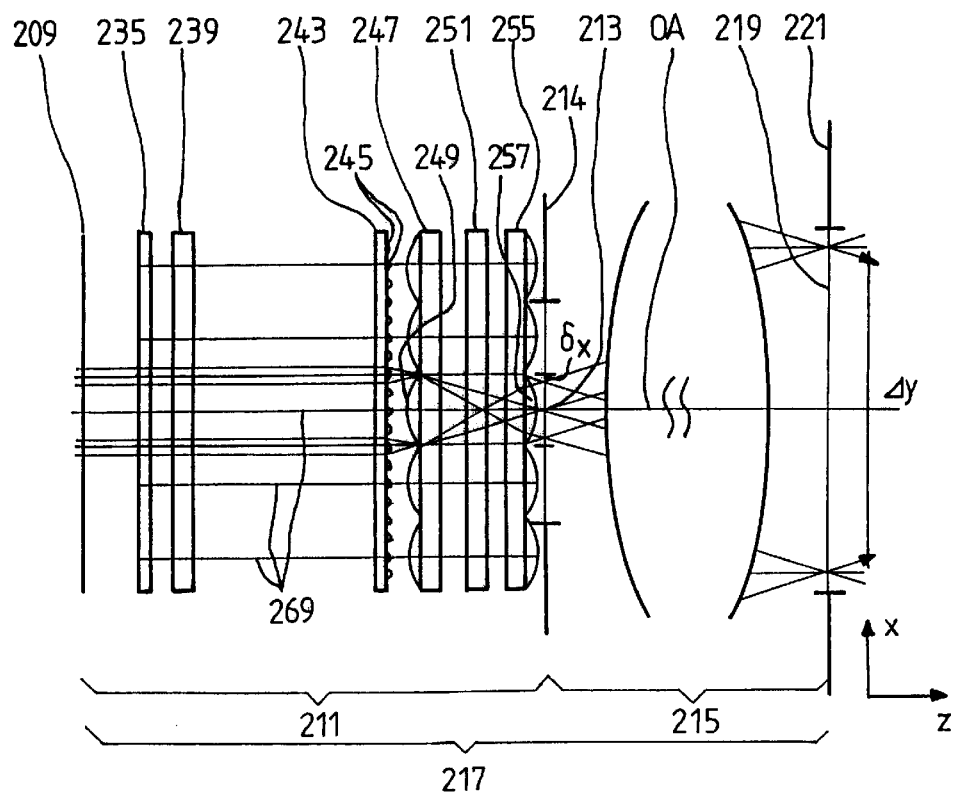

The illustrated fly-eye-integrator field lens module 17 is shown enlarged in FIGS. 3a and 3b. The fly-eye-integrator field lens module 17 illuminates a plane 19 which is conjugated to the reticle plane. A masking device 21 for delimiting the field illumination is disposed in the plane 19. This masking device 21 is also known as REMA (reticle masking). The REMA 21 is imaged in the reticle plane 25 with the aid of a so-called REMA objective 23. The REMA objective 23 is described in U.S. Pat. No. 5,982,558 incorporated herein by reference. The REMA objective 25 has an imaging scale of between 1:1 and 1:5. A scattering disc 17 is mounted forward of the plane having the REMA and homogenizes the pupil illumination and destroys the correlation effects because of the rastering of plates 35, 39, 43, 47, 51 and 55. The scattering disc can, however, also be mounted within the fly-eye-integrator 11 after the plates 39 and 51 with the field raster elements in the proximity of a plane, which is conjugated to the reticle plane 25 or forward of the reticle plane 25. The scattering disc has a low scattering effect which is so designed that the intensity peaks which are generated by the microcylinder lenses in the pupil illumination are broadened up to the spacing of the intensity peaks. The reticle 27 is disposed in the reticle plane 25 and is imaged in the wafer plane 23 by a projection objective 29. Reticle 27 as well as wafer 33 are disposed on a holding device (not shown). This holding device permits the exchange of reticle 27 and wafer 33. In so-called scanner systems, reticle 27 and wafer 33 are moved in the scan direction at the ratio of the imaging scale of the projection objective 29. The scan direction is the y-direction in the present embodiment.

The field to be illuminated in the reticle plane 25 is rectangularly delimited. The rectangle is so aligned that the longer field side is in the x-direction. The x-y aspect ratio of the rectangle has a value of between 2:1 and 12:1.

Embodiment 1

FIGS. 3a and 3b show a first embodiment of a fly-eye-integrator field lens module 217 in schematic representation. FIG. 3a shows a side view (y-z section) and FIG. 3b shows a plan view (x-z section). The elements in FIGS. 3a and 3b, which correspond to the elements of FIGS. 2a and 2b, have the same reference numerals as in FIGS. 2a and 2b increased by 200.

A plate 235 having y-microcylinder lenses 237 follows the entry surface 209 of the fly-eye-integrator 211 in the direction of the light. The y-microcylinder lenses 237 have a width $b_3$ in the y-direction and a length $L_3$ in the x-direction. The length $L_3$ corresponds to the maximum diameter of the fly-eye-integrator 211. The y-microcylinder lenses 237 operate convergently in the meridional section but can also be designed so as to scatter. The optical effect of the y-microcylinder lenses 237 in the meridional section is given by the focal length $f_3$. The y-microcylinder lenses 237 exhibit no optical effect in the sagittal section. In the embodiment 1, these lenses are configured as rod-shaped planar-convex cylinder lenses and are illustrated as planar plates in the x-z section because they have no effect in the sagittal section.

A plate 239 having y-field raster elements 241 follows the plate 235 having y-microcylinder lenses 237. The y-field raster elements 241 have a width $b_1$ in the y-direction and a length $L_1$ in the x-direction which corresponds to the maximum diameter of the fly-eye-integrator 211. The y-field raster elements 241 have a positive power of refraction in the meridional section and a focal length of $f_1$. In the embodiment 1, the y-field raster elements 241 are configured as planar-convex cylinder lenses. The convex surfaces face in the direction of the light source. In the x-z section, the planar-convex cylinder lenses are shown as a planar plate.

A plate 243 having x-microcylinder lenses 245 follows the plate 239 having the y-field raster elements 241. The x-microcylinder lenses 245 have a width $b_4$ in the x-direction and a length $L_4$ in the y-direction which corresponds to the maximum diameter of the fly-eye-integrator 211. The illustrated x-microcylinder lenses 245 operate convergently in the sagittal section but can also be designed to scatter. The optical effect of the x-microcylinder lenses 245 in the sagittal section is given by the focal length $f_4$.

A plate 247 having x-field raster elements 249 follows the plate 243 having the x-microcylinder lenses 245. The x-field raster elements 249 have a width $b_2$ in the x-direction and a length $L_2$ in the y-direction. The length $L_2$ corresponds to the maximum diameter of the fly-eye-integrator 211. The x-field raster elements 249 have a positive power of refraction in the sagittal section and a focal length of $f_2$. In embodiment 1, the x-field raster elements 249 are configured as rod-shaped planar-convex cylinder lenses. The convex surfaces face in the direction of the light source. These convex surfaces are shown as a planar plate in the y-z section.

A plate 251 having y-field pupil raster elements 253 follows the plate 247 having the x-field raster elements 249. The y-pupil raster elements 253 have a positive power of refraction in the meridional section. In the first embodiment, the y-pupil raster elements 253 are configured as planar-convex cylinder lenses. The convex surfaces face away from the light source. In the x-z section, the y-pupil raster elements are shown as a planar plate. The widths of the y-pupil raster elements 253 are equal to the width of the y-field raster elements 241.

A plate 255 having x-pupil raster elements 257 follows the plate 251 having the y-pupil raster elements 253. The x-pupil raster elements 257 have a positive power of refraction in the sagittal section. In the embodiment 1, the x-pupil raster elements 257 are configured as planar-convex lenses and the convex surfaces face away from the light source. In the y-z section, the x-pupil raster elements 257 are shown as a planar plate. The width of the x-pupil raster elements 257 is equal to the width of the x-field raster elements 249.

The plate 255 having the x-pupil raster elements 257 and the plate 251 having the y-pupil raster elements 253 can be exchanged with respect to position in their sequence.

A plane 213 operates as a diaphragm plane for the entire illuminating system and follows after the plates having the pupil raster elements. A field lens 215 is mounted between the diaphragm plane 213 and the field plane 219.

The operation of the fly-eye-integrator field lens module 217, which is built up of the cylinder lens arrays and the field lens 215, is described in greater detail in the following.

The entry surface 209 is illuminated with almost parallel light. In typical laser light sources, the incident parallel light beam gene rally exhibits a divergence in the range of ±25 mrad. The intensity of the illumination and the local angle distribution are almost the same for each field point within the illuminated region.

In FIGS. 3a and 3b, the imaging of the y-field raster elements 241 on the field, which is to be illuminated, in the field plane 219 is shown in the y-z section. The light rays viewed in the following run in the meridional plane. Rays which impinge parallel on the central y-field raster element are focused in the diaphragm plane 213 so that each y-field raster element 241 generates a secondary light source in the diaphragm plane 213. The back focal point for the y-z section of the optical channel is accordingly located in the diaphragm plane 213. The optical channel is formed from the y-field raster element 241, the x-field raster element 249, the y-pupil raster element 253 and the x-pupil raster element 257. The x-field raster element 249 and the x-pupil raster element 257 function only as planar surfaces in this section (y-z section). The rays, which are focused in the diaphragm plane 213, diverge after the diaphragm plane 213 and, in embodiment 1, leave the field lens 215 as parallel rays because the diaphragm plane 213 is mounted in the front focal plane of the field lens 215. The field plane 219 is thereby telecentrically illuminated. In the event that the illumination of the field plate 219 is not to be telecentric, that is, the exit pupil of the illuminating system lies at a finite distance, the centroidal ray angles have to be adjusted via the design of the field lens 215.

Rays, which run parallel in the diaphragm plane 213, are focused in the field plane 219 because the back focal plane of the field lens 215 is disposed in the field plane 219. The width of the illuminated field in the field plane 219 is $\Delta y$ and is determined by the maximum divergence angle of the rays in the diaphragm plane 213.

Without the y-microcylinder lenses 237, the y-field raster elements 241 would be illuminated exclusively with parallel light of low divergence. In this case, the diaphragm plane 213 would be illuminated only with discrete intensity peaks in correspondence to the arrangement of the y-field and x-field raster elements. The ray angles would come from discrete directions in the field plane 219 following after the field lens 215. The y-microcylinder lenses 237 are so arranged in embodiment 1 that the y-field raster elements 241 are not illuminated with a beam parallel to the optical axis but are illuminated in the y-z plane from different directions. The maximum divergence angles are so determined in embodiment 1 that the y-pupil raster elements 253 are completely illuminated. This is the case when a ray of maximum divergence, which impinges at the edge of the y-field raster element 241, runs parallel between the y-field raster element 241 and the y-pupil raster element 253 and impinges on the edge of the y-pupil raster element 253. The rays 259a and 259b impinge parallel to the optical axis on the y-field raster elements 241. In addition to the rays 259a and 259b, two further ray pairs 261a and 261b and 263a and 263b are shown which impinge with maximum divergence on the edge of the y-field raster elements 241. Rays 263a and 261b run parallel to the optical axis between the y-field raster element 241 and the y-pupil raster element 253. The focal length of the y-pupil raster element 253 is so configured that the rays 263a, 259a and 261a and the rays 263b, 259b and 261b, which emanate from an object point on the y-field raster element run parallel to each other in the diaphragm plane. The front meridional focal point of the optical channel is accordingly disposed at the location of the y-field raster element 241. The optical channel is formed from the y-field raster element 241, x-field raster element 249, x-pupil raster element 253 and x-pupil raster element 257. The rays, which run parallel to each other in the diaphragm plane 213, are focused by the field lens into the field plane. The focus, which is formed by the rays 263b, 259b and 261b, lies at the upper field edge and the focus, which is formed by the rays 263a, 259a and 261a, lies at the lower field edge. The y-pupil raster element 253 together with the field lens 215 thereby generate in the y-z section an image of the y-field raster elements 253 in the field plane 219.

The illumination of each optical channel in the diaphragm plane 213 in the y-direction and therefore also the diaphragm plane 213 is determined by the divergence of the rays impinging on the y-field raster elements 241. The maximum ray divergence, in turn, results from the focal length $f_3$ and the width $b_3$ of the y-microcylinder lenses 237. The illumination of the optical channel is related to the parameters of the y-microcylinder lenses 237 and the y-field raster elements 253 in approximation as follows:

$$\eta_y \approx \frac{b_3}{b_1} \cdot \frac{f_1}{f_3} \quad (1)$$

wherein:

$f_3$ is the focal length of the y-microcylinder lenses 237;

$b_3$ is the width of the y-microcylinder lenses 237;

$f_1$ is the focal length of the y-field raster elements 241;

$b_1$ is a width of the y-field raster elements 241;

$\eta_y$ is an index of the extent of illumination, thus: $\eta_y=1.0$ corresponds to virtually complete illumination of the optical channel in the y-direction (see embodiment 1) and $\eta_y=0.5$ corresponds to a half illumination of the optical channel.

The diaphragm plane 213 cannot be completely illuminated because of the finite distance of the y-pupil raster elements 253 from the diaphragm plane 213. Light rays which run parallel between the y-field raster element 241 and the y-pupil raster element 253 are focused on the y-pupil raster element 253 in the direction of the axis 269 of each optical channel. The illuminated surface for each optical channel in the diaphragm plane 213 therefore does not have the width $b_1$ but a width reduced by the value $\delta_y$. For this reason, unilluminated strips of the width $\delta_y$ form in the x-direction in the diaphragm plane 213 at a spacing of $b_1$.

The illuminated surface for each optical channel in the diaphragm plane 213 is not homogeneously illuminated. Instead, intensity fluctuations occur because of the mastering of the y-microcylinder lenses 237. The smaller the width of the y-microcylinder lenses 237 compared to the width of the y-field raster elements 241, the more homogeneously illuminated is the illuminated surface for each raster element.

In FIG. 3b, in the x-z section, the imaging of the x-field raster elements 249 onto the field, which is to be illuminated, is shown in the field plane 219. The imaging takes place in the same manner as the embodiments for imaging the y-field raster elements 241. The back sagittal focal point of the optical channel is, in turn, located in the diaphragm plane 213 and the optical channel is formed from the y-field raster element 241, x-field raster element 249, y-pupil raster element 253 and x-pupil raster element 257. The y-field raster element 241 and the y-pupil raster element 253 are effective only as planar surfaces in this section.

The x-microcylinder lenses 245 are used to increase the illumination of the x-pupil raster elements 257 in that the x-field raster elements 249 are not illuminated with a beam parallel to the optical axis but are illuminated in the x-z plane from various directions. The maximum divergence angles in embodiment 1 are so determined that the x-pupil raster elements 257 are completely illuminated. This is the case when a ray of maximum divergence, which impinges at the edge of an x-field raster element, runs parallel between the x-field raster element and the x-pupil raster element and impinges on the edge of the x-pupil raster element. The front sagittal focal point of the channel, which is formed from y-field raster element 241, x-field raster element 249, y-pupil raster element 253 and x-pupil raster element 257, is located in the x-z section at the location of the x-field raster element 249. The rays, which run parallel in the diaphragm plane 213, are focused by the field lens 215 into the field plane 219. The x-pupil raster elements 257 together with the field lens 215 thereby generate in the x-z section an image of the x-field raster elements 249 in the field plane 215.

The illumination of each optical channel in the diaphragm plane 213 in the x-direction is related to the parameters of the x-microcylinder lenses 245 and the x-field raster elements 249 approximately as follows:

$$\eta_x \approx \frac{b_4}{b_2} \cdot \frac{f_2}{f_4} \quad (2)$$

wherein:

$f_4$ is the focal length of the x-microcylinder lenses 245;

$b_4$ is the width of the x-microcylinder lenses 245;

$f_2$ is the focal length of the x-field raster elements 249;

$b_2$ is the width of the x-field raster elements 249; and $\eta_x$ is the index of the extent of illumination: $\eta_x=1.0$ is almost complete illumination of the optical channel in the diaphragm plane in the x-direction (see embodiment 1) and $\eta_x=0.5$ is half the illumination of the optical channel.

Because of the finite distance of the x-pupil raster elements 257 from the diaphragm plane 213, the diaphragm plane 213 cannot be completely illuminated. Light rays which run parallel between the x-field raster element 249 and the x-pupil raster element 257 are focused on the x-pupil raster element 249 in the direction of the axis of each optical channel 269. The illuminated surface for each optical channel in the diaphragm plane 213 therefore does not have the width $b_2$ but a width reduced by the amount $\delta_x$. Accordingly, unilluminated strips therefore form in the y-direction in the diaphragm plane 213 having a width $\delta_x$ at a spacing of $b_2$.

The unilluminated strips in the x- and y-directions thereby form a lattice of unilluminated strips. The lattice is quadratic when the width $b_1$ of the y-field raster elements and the width $b_2$ of the x-field raster elements are of the same size. By appropriately selecting the radii and thicknesses of the field raster elements and the pupil raster elements and the spacings between the individual components, it can be achieved that the unilluminated strips in the x- and y-directions have the same width $\delta_x=\delta_y$. In this way, one obtains a point symmetrical illumination of the optical plane.

In the following, specific manufacturing data for the fly-eye-integrator field lens module 217 are given for the first embodiment.

TABLE 1

| Element | Surface Number | $R_x$ (mm) | $R_y$ (mm) | d (mm) | Glass | b (mm) | f (mm) |
|---|---|---|---|---|---|---|---|
| y-microcylinder lens | 1 | ∞ | ∞ | 0.503 | $CaF_2$ | 0.30 | 6.50 |
|  | 2 | ∞ | −3.627 | 19.922 |  | 0.30 |  |
| y-field raster element | 3 | ∞ | 26.787 | 2.075 | $CaF_2$ | 4.00 | 48.00 |
|  | 4 | ∞ | ∞ | 20.750 |  | 4.00 |  |
| x-microcylinder lens | 5 | ∞ | ∞ | 0.517 | $CaF_2$ | 0.30 | 1.20 |
|  | 6 | −0.669 | ∞ | 9.756 |  | 0.30 |  |
| x-field raster element | 7 | 8.915 | ∞ | 2.977 | $CaF_2$ | 4.00 | 15.98 |
|  | 8 | ∞ | ∞ | 7.850 |  | 4.00 |  |
| y-pupil raster element | 9 | ∞ | ∞ | 2.082 | $CaF_2$ | 4.00 | 43.74 |
|  | 10 | ∞ | −24.407 | 0.918 |  | 4.00 |  |
| x-pupil raster element | 11 | ∞ | ∞ | 3.001 | $CaF_2$ | 4.00 | 14.51 |
|  | 12 | −8.099 | ∞ | 1.649 |  | 4.00 |  |
| Focal plane | 13 | ∞ | ∞ |  |  |  |  |

Table 1 presents the optical data for the fly-eye-integrator in accordance with the first embodiment for an operating wavelength of λ=157.6 nm. The surface numbers correspond to the sequence of the surfaces in the direction of the light. Surface 1 corresponds to the planar forward surface of plate 235 having the y-microcylinder lenses 237. Surface 13 corresponds to the diaphragm plane 213. The widths b are the widths of the cylinder lenses perpendicular to the respective cylinder axes. The focal lengths f relate to the individual components. The length of the microcylinder lenses, the field raster elements and the pupil raster elements is 120 nm. On one plate, 400 microcylinder lenses or 30 field raster elements or 30 pupil raster elements are arranged. The diameter of the parallel beam, which impinges on the fly-eye-integrator field lens module is 100 mm.

The divergence of the rays within the beam is maximally ±25 mrad at the entry surface of the fly-eye-integrator.

For the illumination index $\eta_y$ of each optical channel in the y-direction, one obtains:

$$\eta_y \approx \frac{b_3}{b_1} \cdot \frac{f_1}{f_3} = \frac{0.3}{4.0} \cdot \frac{48}{6.5} = 0.55$$

For the index of illumination $\eta_x$ of each optical channel in the x-direction, one obtains:

$$\eta_x \approx \frac{b_4}{b_2} \cdot \frac{f_2}{f_4} = \frac{0.3}{4.0} \cdot \frac{15.98}{1.2} = 0.99$$

For the width $\delta_x$ of the unilluminated strips in the y-direction, one obtains: $\delta_x \approx 0.4$ mm.

For the width $\delta_y$ of the unilluminated strips in the x-direction, one obtains $\delta_y \approx 0.4$ mm.

The field lens 215 follows the diaphragm plane 213.

TABLE 2

| Reference Numerals in FIG. 3 | R (mm) | Asphere | D (mm) | Glass |
|---|---|---|---|---|
| 301 | ∞ |  | 3.758 |  |
| 302 | 666.750 | A | 34.984 | $CaF_2$ |
| 303 | −349.228 |  | 0.150 |  |
| 304 | 1146.535 |  | 34.985 | $CaF_2$ |
| 305 | 562.165 |  | 8.088 |  |
| 306 | −1522.323 |  | 30.125 | $CaF_2$ |
| 307 | −130.620 |  | 0.207 |  |
| 308 | 155.847 |  | 31.092 | $CaF_2$ |
| 309 | 348.755 |  | 21.245 |  |

TABLE 2-continued

| Reference Numerals in FIG. 3 | R (mm) | Asphere | D (mm) | Glass |
|---|---|---|---|---|
| 310 | 278.542 |  | 16.679 | $CaF_2$ |
| 311 | −508.154 |  | 34.220 |  |
| 312 | ∞ |  |  |  |

Asphere on surface 302:
Ex=0.00559517
C1=−2.62E-07
C2=−3.16E-11
Asphere equation:

$$z = \frac{\frac{1}{R}h^2}{1+\sqrt{1-(1-EX)\left(\frac{1}{R}\right)^2 h^2}} + \sum_{k=1} c_k h^{2k+2}$$

wherein:
z=arrow height (also called sagitta);
h=height;
R=radius;
EX=eccentricity;
$C_k$=aspheric constants.

Figure 4:
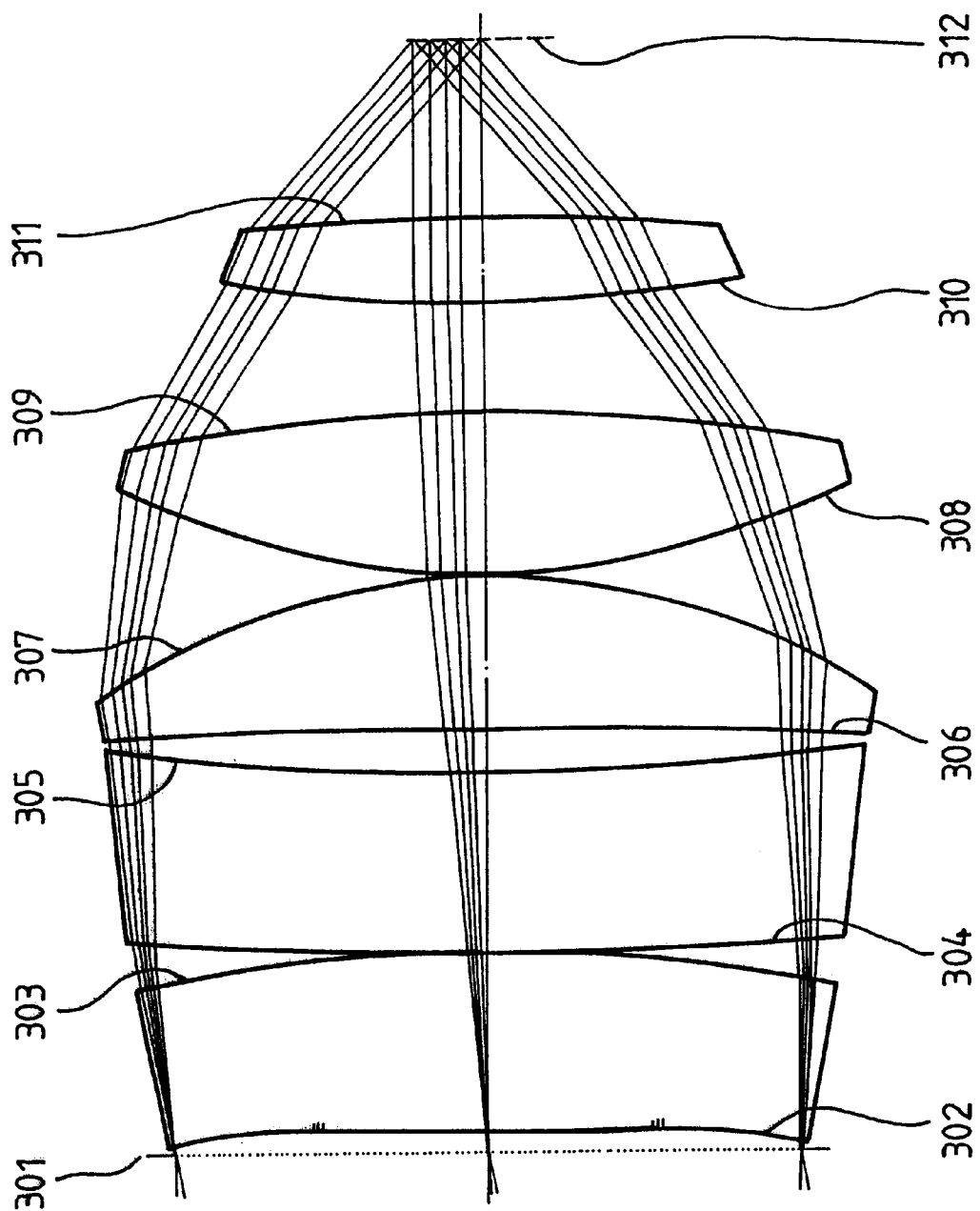
FIG. 4 is a lens section for an aspheric field lens.

In table 2, the optical data is given for the field lens 215, which follows the fly-eye-integrator 211, for the operating wavelength of λ=157.6 nm as it is used also in the other embodiments. The surface numbers show the sequence of surfaces in the direction of the light. Surface 301 corresponds to the diaphragm plane 213. Surface 312 corresponds to the field plane 219. The lens section of the field lens 215 is shown in FIG. 4.

The maximum diameter of the illuminated field in the diaphragm plane is 100 mm.

The rectangular field, which is to be illuminated, has, in the image plane, the dimensions Δx=26.0 mm and Δy=8.0 mm. The lateral aspect ratio is therefore 3.25:1. The aperture in the field plane is NA=0.66.

Figure 5:
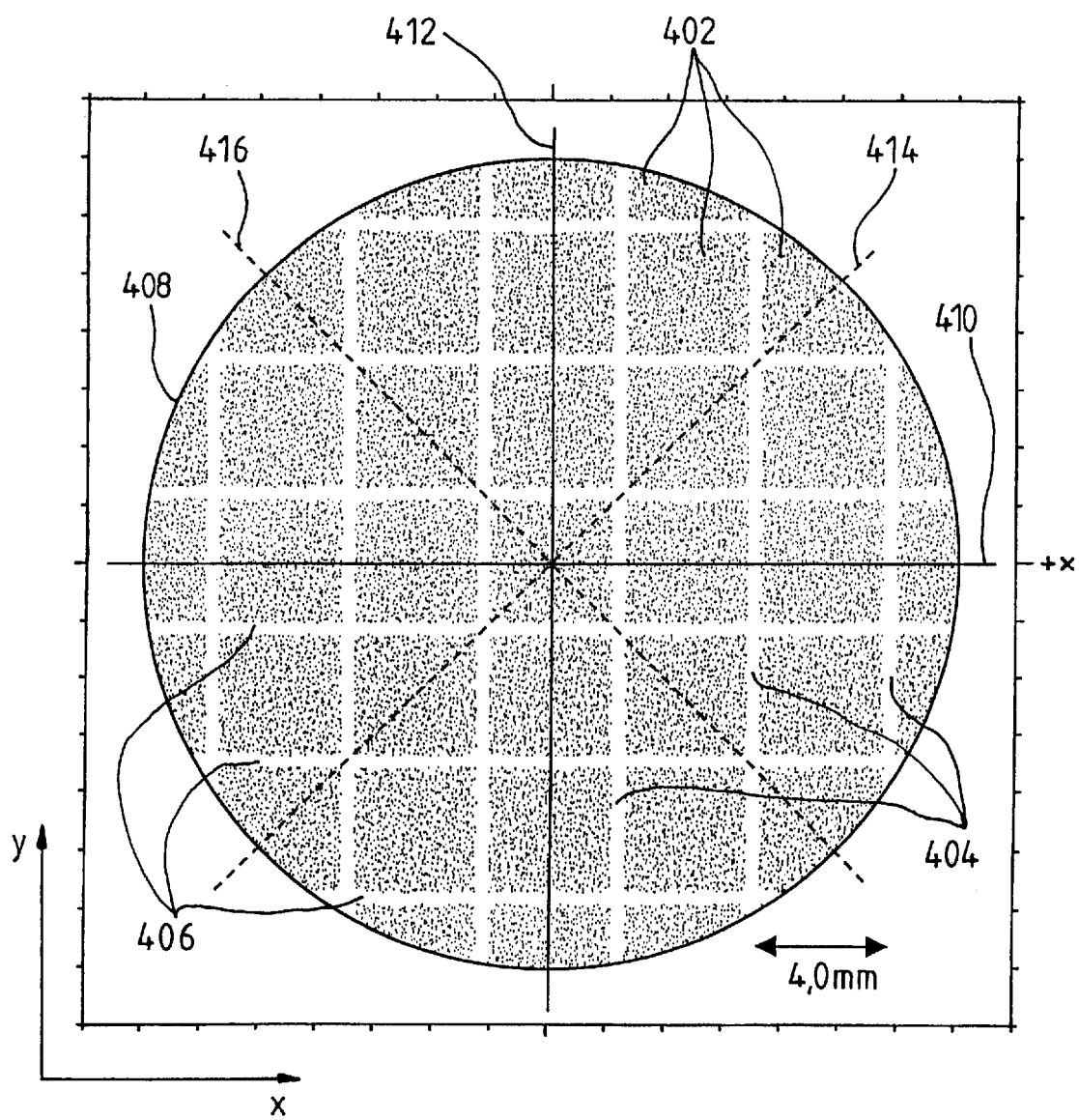
FIG. 5 is a schematic showing the illumination of the diaphragm plane of the illuminating system having a fly-eye-integrator field lens module shown in FIGS. 3a and 3b.

FIG. 5 shows the illumination of the diaphragm plane 213 for a fly-eye-integrator 211 in accordance with Table 1 wherein y-field raster elements 241 and x-field raster elements 249 are illuminated with the field raster elements having the same width of 4.0 mm. The expansion of the illumination of the raster elements is adjusted with the aid of the zoom axicon objective 7. A quadratic lattice having secondary light sources 402 results because of the same widths of the x-field and y-field raster elements. The secondary light sources 402 are likewise quadratic in correspondence with the configuration of the microcylinder lenses. A scattering disc is mounted after the plates having the field raster elements viewed in the direction of the light. With the use of the scattering disc, the secondary light sources 402 are illuminated virtually homogeneously. The discrete illumination of the diaphragm plane 213 because of the microcylinder lenses can no longer be seen. The width $\delta_x$ of the unilluminated strips 404 in the y-direction and the width by of the unilluminated strips 406 in the x-direction between the secondary light sources 402 is of the same size and amounts to 0.4 mm for each case. The ratio of the strip widths to the spacing of the unilluminated strips therefore is 10%. The circular boundary 408 of the illumination occurs because of the circular diaphragm 214 mounted in the diaphragm plane 213. The lines 410 and 412 are shown solid and are perpendicular to each other and delimit four quadrants which have, respectively, the same integral intensity. The quadrants delimited by the broken lines 414 and 416 also each have the same integral intensity. With this kind of illumination, the integral intensity is the same for two sectors in the diaphragm plane which can pass over one into the other via a mirroring on the x-axis and/or y-axis.

Embodiment 2

Figure 6A:
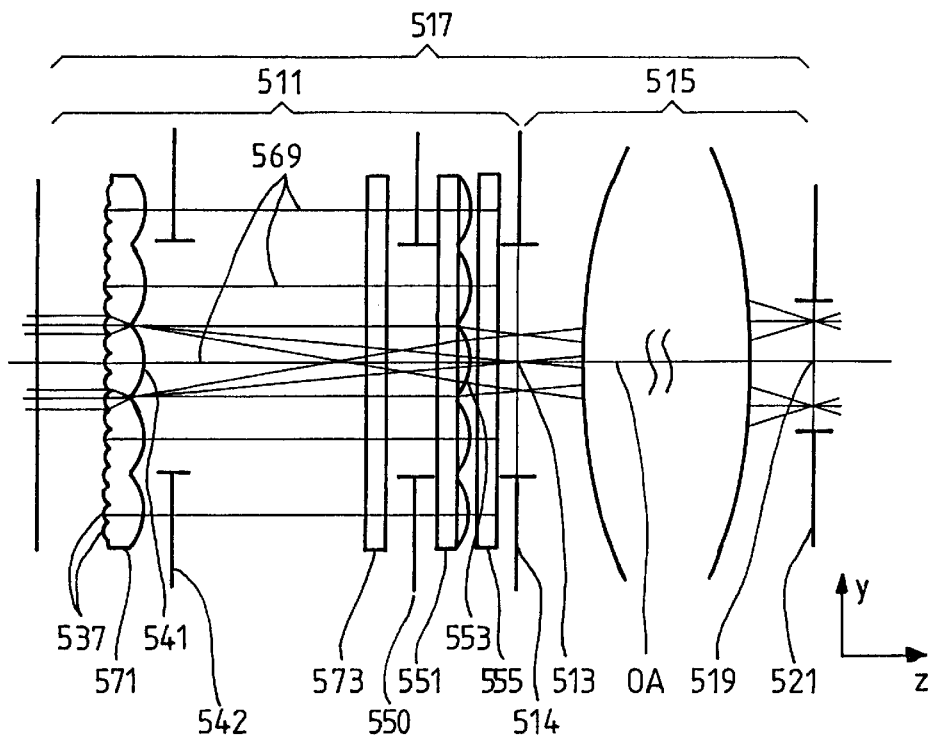
FIGS. 6a and 6b are schematics showing another embodiment for a fly-eye-integrator field lens module.
Figure 6B:
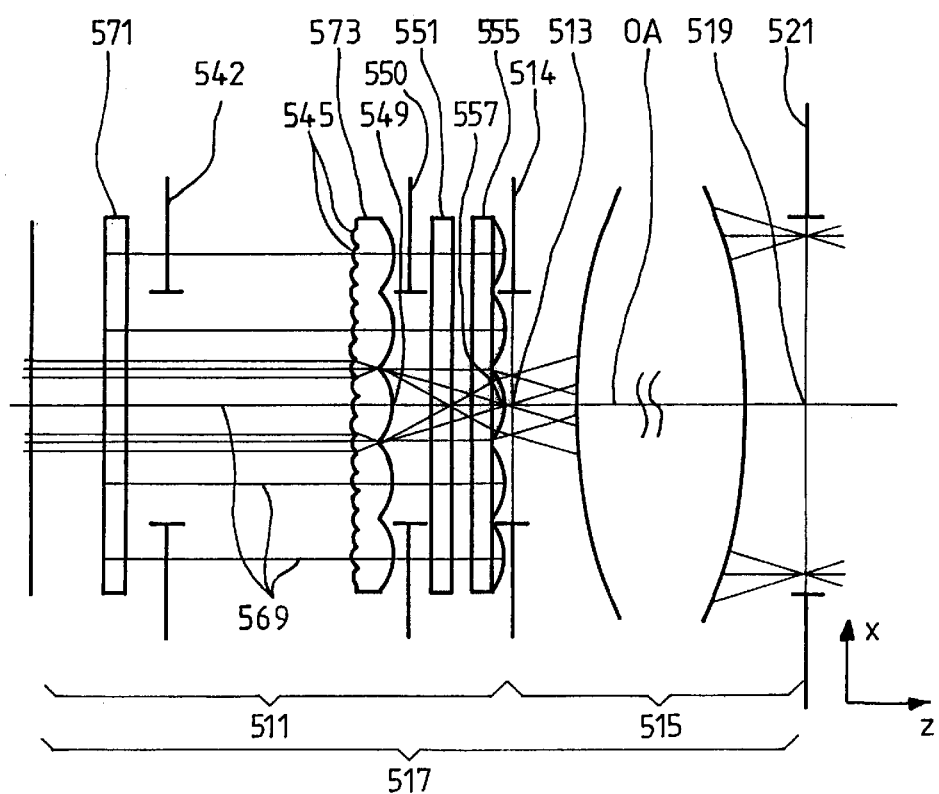

FIGS. 6a and 6b show a second embodiment of a fly-eye-integrator field lens module 517. FIG. 6a shows a side elevation view (y-z section) and FIG. 6b shows a plan view (x-z section). The elements in FIGS. 6a and 6b correspond to those elements in FIGS. 3a and 3b having the same reference numerals as in FIGS. 3a and 3b increased by 300. FIGS. 3a and 3b can be referred to for a description of these elements.

In the second embodiment, the microcylinder lenses and the field raster elements are integrated on one plate. In this way, a total of four boundary surfaces can be omitted and the transmission losses associated therewith are reduced. The plates 235 and 243 with the microcylinder lenses as well as the plates 239 and 247 with the field raster elements in FIGS. 3a and 3b each show a planar surface. The boundary surfaces are eliminated by joining these planar surfaces so that they are contiguous. The structuring of the forward surface with the microcylinder lenses and the rear surface with the field raster elements can be realized instead of joining the two plates via a cement surface or by wringing. The microcylinder lens field raster element plates 571 and 573 which arise in this way are to be so arranged that the microcylinder lenses 537 and 545 are mounted forward of the corresponding field raster elements 571 and 549 viewed in the direction of the light. In the second embodiment, the y-field raster elements 541 as well as the x-field raster elements 549 with the corresponding microcylinder lenses 537 and 545 are integrated on respective plates. As an alternative, only y-field raster elements or only x-field raster elements can be built up as one piece with the microcylinder lenses.

In addition to the diaphragm device 514, two additional diaphragm devices 542 and 550 are mounted downstream of the microcylinder lens field raster element plates 571 and 573. With the interaction of the diaphragm devices 542 and 550, it is possible to so cover the field raster elements that only completely illuminated optical channels come into use. For this reason, the regions of the x-field raster elements 549 and the y-field raster elements 541 which are imaged in the image plane 519 of the illuminating system, are illuminated in their entire width whereby the uniformity of the field illumination is improved. Whereas the optical channels are selected with the diaphragm devices 542 and 550, the illumination of the diaphragm plane in correspondence with pregiven illuminating mode is limited with the diaphragm device 514.

Embodiment 3

Figure 7A:
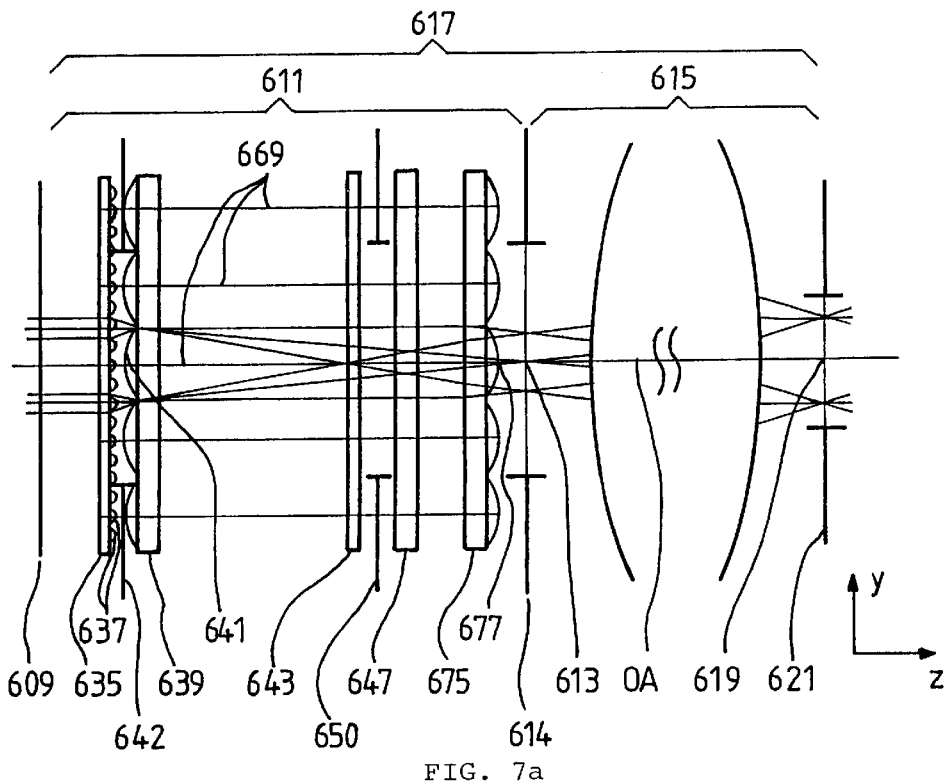
FIGS. 7a and 7b are schematics showing a third embodiment for a fly-eye-integrator field lens module.
Figure 7B:
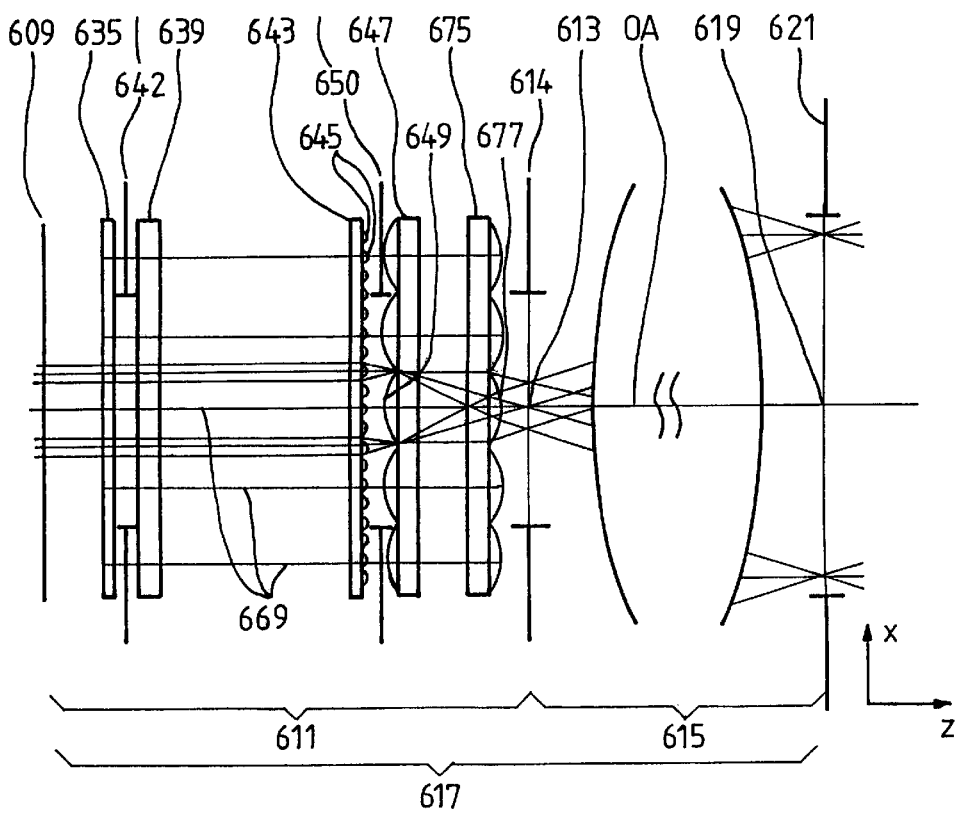

FIGS. 7a and 7b show a third embodiment of a fly-eye-integrator field lens module 617. FIG. 7a shows a side elevation view (y-z section) and FIG. 7b shows a plan view (x-z section). The elements in FIGS. 7a and 7b, which correspond to the elements of FIGS. 3a and 3b, have the same reference numerals as the elements in FIGS. 3a and 3b increased by the number 400. Reference can be made to FIGS. 3a and 3b for a description of these elements.

The third embodiment includes a plate 675 having toric pupil raster elements 677 in lieu of the plate 251 having the y-pupil raster elements 253 and the plate 255 having the x-pupil raster elements 257. The toric pupil raster elements 677 have a positive optical power in the x-section as well as in the y-section. The focal length in the x-section is adapted to the focal length of the x-field raster elements 649 and the focal length in the y-section is adapted to the focal length of the y-field raster elements 641. The adaptation of the x- and y-focal lengths of the toric pupil raster elements 677 takes place in such a manner that the back meridional focal point as well as the back sagittal focal point of the channel is located in the diaphragm plane 613 and the front meridional focal point of this channel is disposed at the location of the y-field raster element 641 and the front sagittal focal point of this channel is disposed at the location of the x-field raster elements 649. The channel is formed from the y-field raster element 641, x-field raster element 649 and toric pupil raster element 677.

In the embodiment 3, the height of the toric pupil raster element 677 in the y-z section is equal to the width $b_1$ of the y-field raster elements 641 and the width of the toric pupil raster element 677 in the x-z section is equal to the width $b_2$ of the x-field raster element 649.

Two diaphragm devices 642 and 540 are mounted forward of the plates 639 and 647 having field raster elements. The diaphragm devices 642 and 540 satisfy the same function as the diaphragm devices 542 and 550 in the second embodiment.

Embodiment 4

Figure 8A:
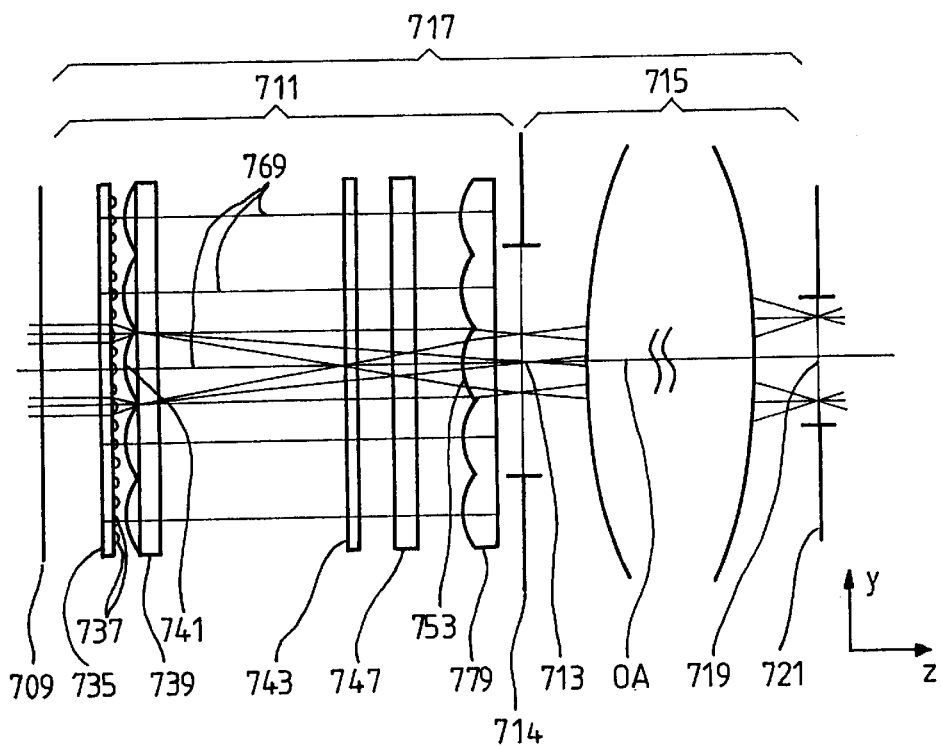
FIGS. 8a and 8b are schematics of a fourth embodiment of a fly-eye-integrator field lens module.
Figure 8B:
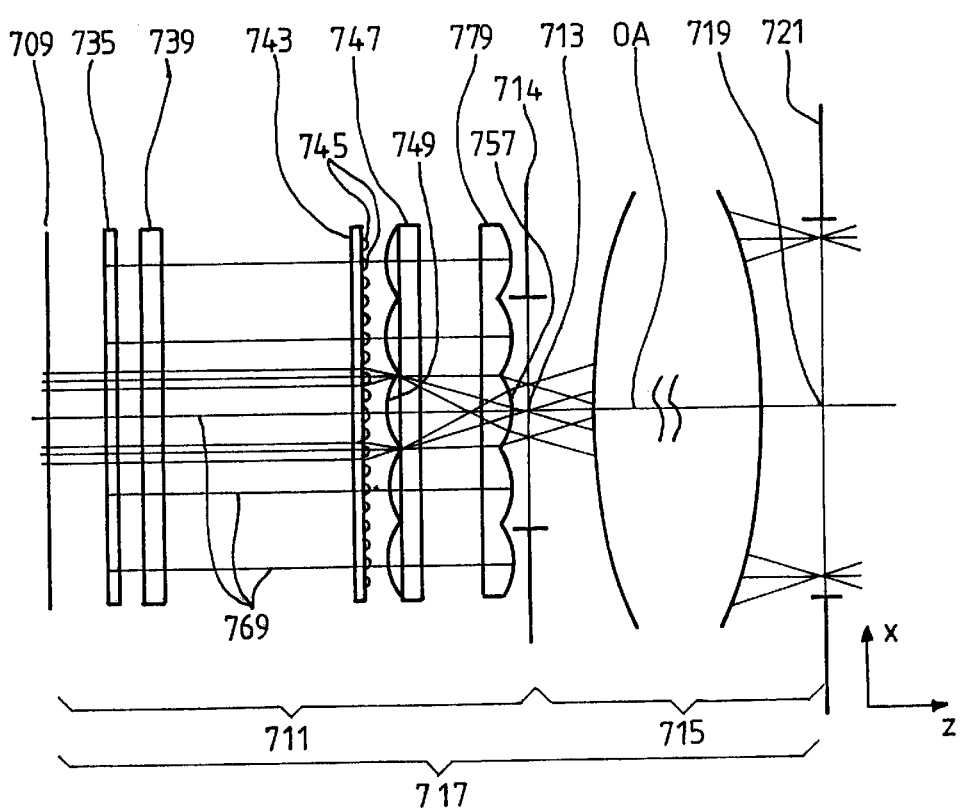

FIGS. 8a and 8b show a fourth embodiment of a fly-eye-integrator field lens module 717. FIG. 8a shows a side elevation view (y-z section) and FIG. 8b shows a plan view (x-z section). The elements in FIGS. 8a and 8b which correspond to the elements in FIGS. 3a and 3b have the same reference numerals as in FIGS. 3a and 3b increased by the number 500. Reference can be made to FIGS. 3a and 3b for a description of these elements.

In the fourth embodiment, the y-pupil raster elements 653 and the x-pupil raster elements 657 are integrated on a plate 679. In this way, a total of two boundary surfaces is saved and the transmission losses associated therewith are reduced. The plate 251 having the y-pupil raster elements 253 as well as the plate 255 with the x-pupil raster elements 257 in FIGS. 3a and 3b each show a planar surface. By joining these planar surfaces to each other so that they are contiguous, the boundary surfaces are eliminated. In addition to the connection of the two plates via a cement surface or by wringing to a plate 679, the structuring of the forward surface of the plate 679 with the y-pupil raster elements 653 and of the rear surface with the x-pupil raster elements 657 can also be realized.

Embodiment 5

Figure 9A:
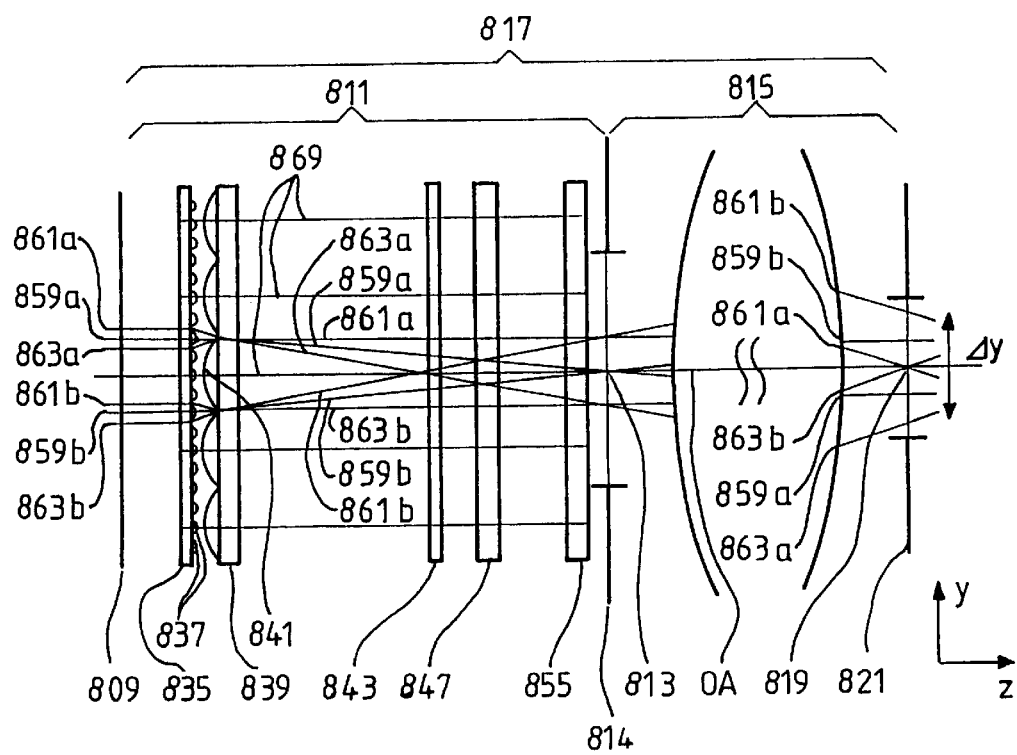
FIGS. 9a and 9b are schematics of a fifth embodiment of a fly-eye-integrator field lens module; and, FIGS. 10a and 10b are schematics of a sixth embodiment of a fly-eye-integrator field lens module.
Figure 9B:
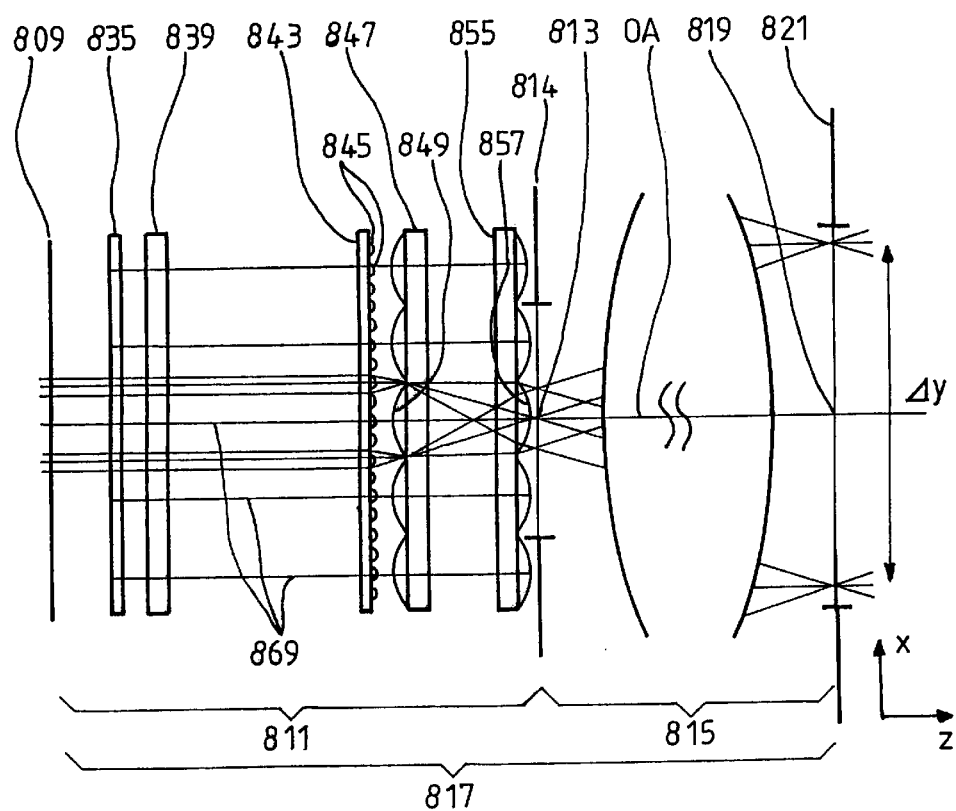

FIGS. 9a and 9b show a fifth embodiment of a fly-eye-integrator field lens module 817 in schematic representation. FIG. 9a shows a side elevation view (y-z section) and FIG. 9b shows a plan view (x-z section). The elements in FIGS. 9a and 9b which correspond to the elements in FIGS. 3a and 3b have the same reference numerals as in FIGS. 3a and 3b increased by the number 600. Reference can be made to FIGS. 3a and 3b for a description of these elements.

The assembly of the fifth embodiment corresponds to the assembly of the first embodiment of FIGS. 3a and 3b except for the omitted plate 251 having y-pupil raster elements 253. Without the y-pupil raster elements 253, the illumination in the field plane is widened because the y-field raster elements 841 are no longer imaged with sharp edges.

In the following, the image of the central y-field raster element 841 lying on the optical axis is viewed in the y-z section. The axis of the optical channel, which is formed from the y-field raster element 841, x-field raster element 849 and x-pupil raster element 857, is therefore coincident with the optical axis OA of the fly-eye-integrator 811. The diaphragm plane 813 is located in the back focal point of the optical channel. For this reason, the beam pairs (859a, 859b; 861a, 861; and 863a, 863b) are focused in the diaphragm plane. The foci for the beams delimited by the ray pairs (861a, 861b) and (863a, 863b) are disposed, respectively, on the edge of the optical channel in the diaphragm plane. The centroid rays of the beams, which are delimited by the ray pairs (861a, 861b) and (863a, 863b) run in the diaphragm plane 813 not parallel to the axis of the optical channel as is the case in embodiment 1 with the y-pupil raster element 253 but instead diverge from the axis 869 of the optical channel. While the angular difference of the ray pairs (859a, 859b; 861a, 861b; and 863a, 863b) is the same size in the diaphragm plane 813, the centroid ray direction of the beams delimited by the ray pairs (861a, 861b; 863a, 863b) is dependent upon the location in the diaphragm plane 813. For this reason, higher centroid ray angles with respect to the axes 869 of the optical channels occur at the edges of the optical channels in the diaphragm plane 813 than on the axes 869 of the optical channels. These higher ray angles lead to an expansion of the illumination after the field lens 815 in the field plane 819 compared to an assembly with the y-pupil raster elements 253. The expansion Δy of the illumination is determined by the ray angles with reference to the optical axis OA with this ray angle occurring maximally in the diaphragm plane 813.

The rays 863a and 861b having the maximal ray angles with respect to the optical axis in the diaphragm plane 813 run, in the fifth embodiment, through the upper and lower edge of the illuminated region of the individual optical channels in the diaphragm plane 813. The rays 861b and 863a strike after propagation through the field lens 815 on the upper and lower edges of the illuminated field in the field plane 819. The uppermost object point in the field plane 819 is illuminated by the rays which come, respectively, from the upper edges of the individual optical channels. The centroid ray of this beam corresponds to ray 861b and runs convergently to the optical axis OA. The lowermost object point in the field plane 819 is illuminated by rays which come from the respective lower edges of the individual optical channels. The centroid ray of this beam corresponds to ray 863a and runs convergently to the optical axis OA. The pupil illumination in the field plane 819 is therefore no longer telecentric. Toward the field edge, the centroid ray angle, which indicates the centroid point of the pupil illumination, is displaced in correspondence to the expansion of the y-field raster elements 841 or the optical channels.

The rays 859a, 861a and 863a or 859b, 861b and 863b emanate from an object point on the y-field raster elements. If one views these rays, they are no longer focused in the field plane 819. The y-field raster elements 841 are no longer imaged in the field plane 819. The intensity distribution of the rectangular field is therefore no longer step-shaped in a section along the y-axis; rather, the intensity distribution has a transition region at the edge wherein the intensity drops linearly.

The fifth embodiment in FIGS. 9a and 9b shows the extreme case wherein the intensity distribution of the rectangular field has a triangular shape in a section along the y-axis. The intensity increases on both sides of the optical axis linearly from zero up to a maximum which lies on the optical axis OA. The width Δy of the illumination is precisely twice as large as with the use of y-pupil raster elements 253. This is the case when the ray pairs 861a, 861b and 863a, 863b impinge on the y-field raster element at the maximum possible incidence angle so that these ray pairs are focused in the diaphragm plane on the edges of the respective optical channels. If the ray pairs are not focused on the edges of the respective optical channels, but are between the axis and the edge of the optical channel, then the intensity in the field plane increases linearly in a section along the y-axis to a plateau whereat the intensity is constant.

An intensity distribution as it results for the fifth embodiment is sufficient for a scanner illumination system. The x-field raster elements and the x-pupil raster elements generate a constant course of intensity in the x-direction. In the y-direction which in this case is the scanning direction, there results a position dependent trace. For scanning systems, only the scan energy is of significance which results as a line integral in the scan direction as a function of the intensity distribution and has virtually the same magnitude for each object point in the field plane 819 because of the constant intensity trace in the x-direction.

Embodiment 6

Figure 10A:
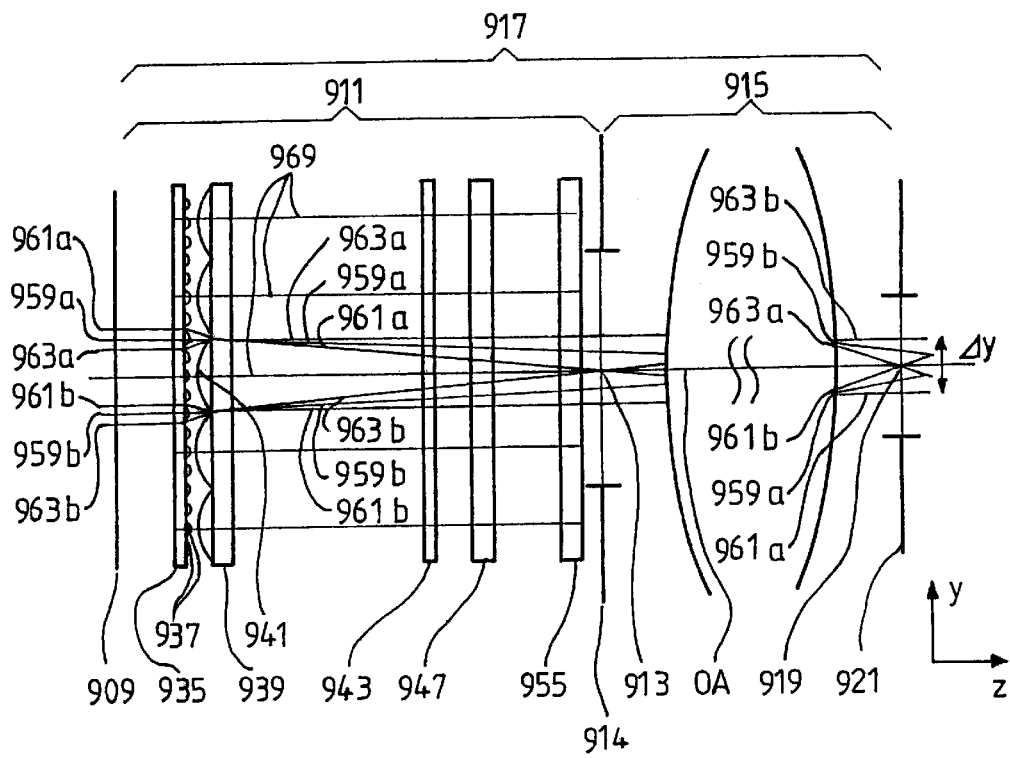
Figure 10B:
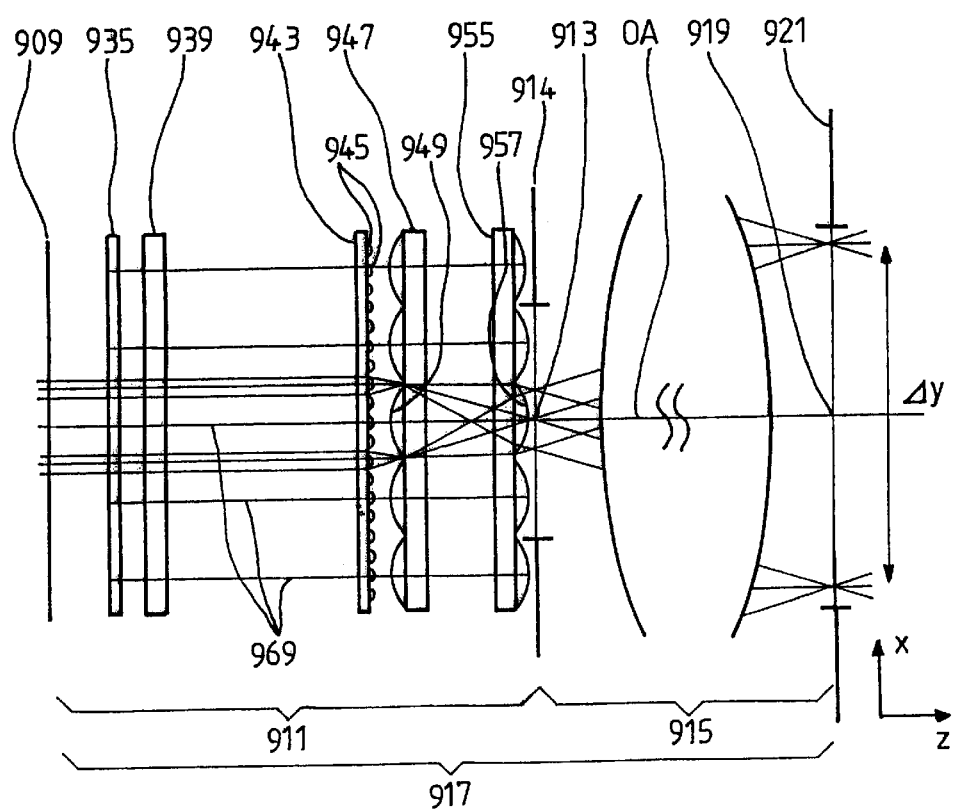

FIGS. 10a and 10b show a sixth embodiment for a fly-eye-integrator field lens module 917. FIG. 10a shows a side elevation view (y-z section) and FIG. 10b shows a plan view (x-z section). The elements in FIGS. 10a and 10b which correspond to the elements in FIGS. 3a and 3b have the same reference numerals as in FIGS. 3a and 3b increased by the number 700. Reference can be made to FIGS. 3a and 3b for a description of these elements.

The configuration of the sixth embodiment corresponds to the configuration of the fifth embodiment with the difference that the back meridional focal point of the optical channel is no longer located in the diaphragm plane 913. The optical channel is formed from the y-field raster element 941, x-field raster element 949 and x-pupil raster element 957. The optical effect and the arrangement of the y-field raster elements 941 are so determined that the rays 961a and 963b intersect with the maximum ray angle with respect to the optical axis in the diaphragm plane (diaphragm plane 913) on the axis 969 of the corresponding optical channel. This is the case when the distance of the diaphragm plane 913 to the back meridional focal point of the optical channel is equal to half the meridional focal length. If one propagates the rays 961a and 963b through the field lens 915 in the field plane 919, then the rays impinge on the upper and lower edges of the illuminated field and run parallel to the optical axis OA. The rays 961a and 963b simultaneously define the centroid rays of the beams, which impinge on the uppermost and lowermost edges, so that the field plane is telecentrically illuminated. The other points in the field plane 919 are also telecentrically illuminated. The intensity distribution reduces toward the field edge in the y-direction because the angle distribution in the diaphragm plane 913 is dependent on location within an optical channel. If each optical channel is completely illuminated in the diaphragm plane 913, then a triangular-shaped intensity distribution results in the y-section in the field plane 919. The width Δy of the illumination is twice as large as with the use of y-pupil raster elements 253. For incomplete illumination, the intensity trace increases linearly from the field edge up to a plateau within which the intensity trace is constant.

TABLE 3

| Element | Surface Numeral | $R_x$ (mm) | $R_y$ (mm) | d (mm) | Glass | b (mm) | f (mm) |
|---|---|---|---|---|---|---|---|
| y-microcylinder lens | 1 | ∞ | 3.627 | 0.503 | $CaF_2$ | 0.30 | 6.50 |
|  | 2 | ∞ | ∞ | 9.959 |  | 0.30 |  |
| y-field raster element | 3 | ∞ | 48.500 | 2.041 | $CaF_2$ | 4.00 | 86.92 |
|  | 4 | ∞ | ∞ | 17.562 |  | 4.00 |  |
| x-microcylinder lens | 5 | 0.669 | ∞ | 0.517 | $CaF_2$ | 0.30 | 1.20 |
|  | 6 | ∞ | ∞ | 27.673 |  | 0.30 |  |
| x-field raster element | 7 | 8.915 | ∞ | 2.277 | $CaF_2$ | 4.00 | 15.98 |
|  | 8 | ∞ | ∞ | 11.000 |  | 4.00 |  |
| x-pupil raster element | 9 | ∞ | ∞ | 2.251 | $CaF_2$ | 4.00 | 14.51 |
|  | 10 | −8.099 | ∞ | 1.749 |  | 4.00 |  |
| Diaphragm plane | 11 | ∞ | ∞ |  |  |  |  |

In Table 3, the optical data for the fly-eye-integrator according to the sixth embodiment are shown for an operating wavelength of λ=157.6 nm. The surface numerals are in the sequence of the surfaces in the direction of the light. Surface 1 corresponds to the planar forward surface of the plate 935 having the y-microcylinder lenses 937. Surface 10 corresponds to the diaphragm plane 913. The widths b are then the widths of the cylinder lenses perpendicular to the respective cylinder axes. The focal lengths f refer to the individual components. The length of the microcylinder lenses, the field raster elements and the pupil raster elements is 120 mm. Here, 400 microcylinder lenses or 30 field raster elements or 30 pupil raster elements are mounted on a plate. The diameter of the parallel beam, which impinges on the fly-eye-integrator field lens module, is 100 mm.

The divergence of the rays within the beam is a maximum of ±25 mrad at the entry surface of the fly-eye-integrator.

For the degree of illumination $\eta_x$ of each optical channel in the x-direction, one obtains:

$$\eta_x = \frac{b_4}{b_2} \cdot \frac{f_2}{f_4} = 1.0.$$

The embodiments presented are especially applicable for illuminating systems which exhibit a high lateral aspect ratio of the field, which is to be illuminated, and operating wavelengths in the VUV, for example, 193 nm, 157 nm or 126 nm. At these wavelengths, the absorption in the material is significant so that, as a mixing element, a fly-eye-integrator is to be preferred with respect to transmission losses to a totally reflecting glass rod. With the splitting of the raster element plates into arrays having cylinder lenses arranged perpendicularly to each other, fields having a high aspect ratio can be illuminated with easily producible components. Here, it is shown for the first time how, in this type of fly-eye-integrator, the diaphragm plane can be almost completely illuminated with the use of microcylinder lenses.

It is understood that the foregoing description is that of the preferred embodiments of the invention and that various changes and modifications may be made thereto without departing from the spirit and scope of the invention as defined in the appended claims.

What is claimed is:

1. An illuminating system of a microlithographic projection exposure apparatus comprising:

a light source;

a first objective defining an optical axis;

a fly-eye-integrator mounted on said axis and being illuminated by said first objective with light from said light source to form a plurality of beams;

said fly-eye-integrator including a first one-dimensional array of first cylinder lenses having respective first cylinder axes; a second one-dimensional array of second cylinder lenses having respective second cylinder axes orientated perpendicularly to said first cylinder axes; a third one-dimensional array of third cylinder lenses having respective third cylinder axes orientated parallel to said first cylinder axes; and, a fourth one-dimensional array of fourth cylinder lenses having respective fourth cylinder axes orientated parallel to said second cylinder axes;

said third one-dimensional array being configured for increasing divergence and being disposed upstream of said first one-dimensional array; and, said fourth one-dimensional array being configured for increasing divergence and being mounted on said optical axis upstream of said second one-dimensional array;

a diaphragm plane on said optical axis directly downstream of said fly-eye-integrator; and, a condenser optic for superposing said plurality of beams into an image plane to illuminate a field.

2. The illuminating system of claim 1, wherein said first cylinder lenses have first focal lengths, respectively, and said second cylinder lenses have second focal lengths, respectively; and, said first focal lengths are greater than said second focal lengths.

3. The illuminating system of claim 2, wherein said first focal lengths are greater than said second focal lengths by a factor of 1.5.

4. The illuminating system of claim 1, wherein said first cylinder lenses have first widths and said second cylinder lenses have second widths; and, said first widths are almost equal to said second widths.

5. The illuminating system of claim 1, wherein said first cylinder lenses have first widths and said second cylinder lenses have second widths; said third cylinder lenses have third widths and said fourth cylinder lenses have fourth widths; said first widths are at least twice said third widths; and, said second widths are at least twice said fourth widths.

6. The illuminating system of claim 5, wherein said first widths are at least five times said third widths and said second widths are at least five times said fourth widths.

7. The illuminating system of claim 5, wherein said third widths are equal to said fourth widths.

8. The illuminating system of claim 5, wherein said third cylinder lenses have third focal lengths, respectively; said fourth cylinder lenses have fourth focal lengths, respectively; said third width and said third focal length of each of said third cylinder lenses define a third width/focal length ratio; said first cylinder lenses have first focal lengths, respectively; said first width and said first focal length of each of said first cylinder lenses define a first width/focal length ratio; said fourth width and said fourth focal length of each of said fourth cylinder lenses define a fourth width/focal length ratio; and, said third width/focal length ratio is less than said first width/focal length ratio and/or said fourth width/focal length ratio is less than said second width/focal length ratio.

9. The illuminating system of claim 8, wherein said third width/focal length ratio is at least one half of said first width/focal length ratio and/or said fourth width/focal length ratio is at least half of said second width/focal length ratio.

10. The illuminating system of claim 1, wherein said fly-eye-integrator has first and/or second one-piece plates and each of said one-piece plates has a forward side facing upstream and a rearward side facing downstream; said third cylinder lenses are mounted on the forward side of said first one-piece plate and said first cylinder lenses are mounted on said rearward side of said first one-piece plate; and/or said fourth cylinder lenses are mounted on said forward side of said second one-piece plate and said second cylinder lenses are mounted on said rearward side of said second one-piece plate.

11. The illuminating system of claim 1, wherein said diaphragm plane is accessible.

12. The illuminating system of claim 11, wherein said system further comprises a diaphragm device mounted in said diaphragm plane for controlling the illumination of said diaphragm plane.

13. The illuminating system of claim 1, wherein said system further comprises a first diaphragm device mounted forward or rearward of said first one-dimensional array of said first cylinder lenses and/or a second diaphragm device for controlling an illumination of said diaphragm plane is mounted forward or rearward of said second one-dimensional array.

14. The illuminating system of claim 1, wherein said fly-eye-integrator further includes a two-dimensional array of toric lenses in the vicinity of said diaphragm plane; each of said toric lenses having two mutually perpendicular first and second main axes; said first main axis is parallel to said first cylinder axes; and, said second main axis is parallel to said second cylinder axes.

15. The illuminating system of claim 14, wherein one of said toric lenses together with one of said first cylinder lenses and one of said second cylinder lenses conjointly define an optical channel having a common linear axis; and, said optical channel defining a back focal point located near or in said diaphragm plane.

16. The illuminating system of claim 15, wherein said optical channel intersects a first plane having a normal pointing in the direction of said first cylinder axes and said first plane containing said common linear axis of said optical channel; said optical channel has a meridional front focal point at the intersection thereof with said first plane which is at the location of the first cylinder lens; said optical channel intersects a second plane having a normal pointing in the direction of said second cylinder axes and said second plane containing said common linear axis of said optical channel; and, said optical channel has a sagittal front focal point at the intersection with said second plane which front focal point is at the location of the second cylinder lens.

17. The illuminating system of claim 1, wherein said fly-eye-integrator has a fifth one-dimensional array of fifth cylinder lenses having fifth cylinder axes parallel to said second cylinder axes; and, said fifth one-dimensional array is disposed in the vicinity of said diaphragm plane.

18. The illuminating system of claim 17, wherein one of said fifth cylinder lenses together with one of said first cylinder lenses and one of said second cylinder lenses conjointly define an optical channel having a common axis; said optical channel intersects a sagittal plane having a normal pointing in the direction of said second cylinder axes and said sagittal plane containing said common axis of said optical channel; and, said optical channel has a sagittal back focal point at the intersection with said sagittal plane which sagittal back focal point is located in or in the vicinity of said diaphragm plane.

19. The illuminating system of claim 18, wherein said optical channel intersects said sagittal plane; and, said optical channel has a sagittal front focal point at the intersection with said sagittal plane which is at the location of the second cylinder lens.

20. The illuminating system of claim 18, wherein said optical channel intersects a meridional plane having a normal pointing in the direction of said first cylinder axes and said meridional plane containing the axis of said optical channel; and, said optical channel has a meridional back focal point at the intersection with said meridional plane which is at the location of said diaphragm plane or in the vicinity of said diaphragm plane.

21. The illuminating system of claim 18, wherein said optical channel intersects a meridional plane having a normal pointing in the direction of said first cylinder axes and said meridional plane contains the axis of said optical channel; said optical channel has a meridional back focal point at the intersection of said optical channel and said meridional plane and a meridional focal length; and, the spacing between said diaphragm plane and said meridional back focal point is almost equal to half of the meridional focal length.

22. The illuminating system of claim 17, wherein said fly-eye-integrator includes a sixth one-dimensional array of sixth cylinder lenses having sixth cylinder axes, respectively, in the vicinity of said diaphragm plane; and, said sixth cylinder axes are aligned parallel to said first cylinder axes.

23. The illuminating system of claim 22, wherein one of said sixth cylinder lenses together with one of said fifth cylinder lenses, one of said second cylinder lenses and one of said first cylinder lenses conjointly define an optical channel having a common linear axis; and, said optical channel having a back focal point which is in said diaphragm plane or in the proximity thereof.

24. The illuminating system of claim 22, wherein one of said sixth cylinder lenses together with one of said fifth cylinder lenses, one of said second cylinder lenses and one of said first cylinder lenses conjointly define an optical channel having a common linear axis; said optical channel having a back focal point which is in said diaphragm plane or in the proximity thereof; said optical channel intersects a meridional plane having a normal pointing in the direction of said first cylinder axes and said meridional plane containing said common linear axis; said optical channel has a meridional front focal point disposed at the intersection of said optical channel with said meridional plane at the location of said first cylinder lens; wherein said optical channel intersects a sagittal plane having a normal pointing in the direction of said second cylinder axes and said sagittal plane containing said axis of said optical channel; and, said optical channel having a sagittal front focal point at the intersection of said optical channel with said sagittal plane located at the location of the second cylinder lens.

25. The illuminating system of claim 22, wherein said first cylinder lenses, said second cylinder lenses, said fifth cylinder lenses and said sixth cylinder lenses all have the same width.

26. The illuminating system of claim 22, wherein said first cylinder lenses have first widths and said second cylinder lenses have second widths; and, wherein said fly-eye-integrator, said third one-dimensional array and said fourth one-dimensional array conjointly illuminate said diaphragm plane with the illumination of said diaphragm plane including unilluminated first strips in the direction of said first cylinder axes mutually spaced at a distance corresponding to a first width; said first strips each having a width corresponding to a maximum of 20% of said first width; and, said illumination of said diaphragm plane including unilluminated second strips in the direction of said second cylinder axes mutually spaced at a distance corresponding to a second width; and, said second strips having a width corresponding to a maximum of 20% of said second width.

27. The illuminating system of claim 26, wherein the width of said first strips is equal to the width of said second strips.

28. The illuminating system of claim 22, wherein said fly-eye-integrator has a one-piece plate having a forward side facing upstream and a rearward side facing downstream; and, said fifth cylinder lenses are mounted on said forward side and said sixth cylinder lenses are mounted on said rearward side.

29. An illuminating system of a microlithographic projection exposure arrangement comprising:
  a light source;
  a first objective defining an optical axis;
  a fly-eye-integrator mounted on said axis and being illuminated by said first objective with light from said light source to form a plurality of beams;
  said fly-eye-integrator including a first one-dimensional array of first cylinder lenses having respective first cylinder axes; a second one-dimensional array of second cylinder lenses having respective second cylinder axes orientated perpendicularly to said first cylinder axes; and, a third one-dimensional array of third cylinder lenses having respective third cylinder axes orientated parallel to said second cylinder axes;
  a diaphragm plane on said optical axis directly downstream of said fly-eye-integrator; and,
  said third one-dimensional array being disposed in the vicinity of said diaphragm plane.

30. The illuminating system of claim 29, wherein one of said third cylinder lenses together with one of said first cylinder lenses and one of said second cylinder lenses conjointly define an optical channel having a common linear axis; said optical channel intersects a sagittal plane having a normal pointing in the direction of said second cylinder axes and said sagittal plane containing said common linear axis; and, said optical channel has a sagittal back focal point at the intersection thereof with said sagittal plane at or near said diaphragm plane.

31. The illuminating system of claim 30, wherein said optical channel intersects said sagittal plane; and, said optical channel has a sagittal front focal point at the intersection of said optical channel with said sagittal plane at the location of the second cylinder lens.

32. The illuminating system of claim 30, wherein said optical channel intersects a meridional plane having a normal in the direction of said first cylinder axes and said meridional plane containing said common linear axis; and, said optical channel has a meridional back focal point at the intersection of said optical channel with said meridional plane disposed in or near said diaphragm plane.

33. The illuminating system of claim 30, wherein said optical channel intersects a meridional plane having a normal in the direction of said first cylinder axes and said meridional plane containing said common linear axis; said optical channel has a meridional back focal point at the intersection of said optical channel with said meridional plane; and, the distance between said diaphragm plane and the meridional back focal point being approximately equal to half of the meridional focal length.

34. A microlithographic projection exposure arrangement comprising:
  an illuminating system including:
    a light source;
    a first objective defining an optical axis;
    a fly-eye-integrator mounted on said axis and being illuminated by said first objective with light from said light source to form a plurality of beams; said fly-eye-integrator including a first one-dimensional array of first cylinder lenses having respective first cylinder axes; a second one-dimensional array of second cylinder lenses having respective second cylinder axes orientated perpendicularly to said first cylinder axes; a third one-dimensional array of third cylinder lenses having respective third cylinder axes orientated parallel to said first cylinder axes; and, a fourth one-dimensional array of fourth cylinder lenses having respective fourth cylinder axes orientated parallel to said second cylinder axes; said third one-dimensional array being configured for increasing divergence and being disposed forward of said first one-dimensional array; and, said fourth one-dimensional array being configured for increasing divergence and being mounted on said optical axis forward of said second one-dimensional array;
    a diaphragm plane on said optical axis directly downstream of said fly-eye-integrator;
    a condenser optic for superposing said plurality of beams into an image plane to illuminate a field;
  a first carrier system for supporting a mask on said optical axis downstream of said condenser optic;
  a projection objective arranged on said optical axis downstream of said mask; and,
  a second carrier system for supporting a light sensitive substrate on said optical axis and downstream of said projection objective.

35. A method of making microstructured components comprising the steps of:
  providing a microlithographic projection exposure arrangement including: an illuminating system including: a light source; a first objective defining an optical axis; a fly-eye-integrator mounted on said axis and being illuminated by said first objective with light from said light source to form a plurality of beams; said fly-eye-integrator including a first one-dimensional array of first cylinder lenses having respective first cylinder axes; a second one-dimensional array of second cylinder lenses having respective second cylinder axes orientated perpendicularly to said first cylinder axes; a third one-dimensional array of third cylinder lenses having respective third cylinder axes orientated parallel to said first cylinder axes; and, a fourth one-dimensional array of fourth cylinder lenses having respective fourth cylinder axes orientated parallel to said second cylinder axes; said third one-dimensional array being configured for increasing divergence and being disposed forward of said first one-dimensional array; and, said fourth one-dimensional array being configured for increasing divergence and being mounted on said optical axis forward of said second one-dimensional array; a diaphragm plane on said optical axis directly downstream of said fly-eye-integrator; a condenser optic for superposing said plurality of beams into an image plane to illuminate a field;

a first carrier system for supporting a mask on said optical axis downstream of said condenser optic; a projection objective arranged on said optical axis downstream of said mask; and, a second carrier system for supporting a light sensitive substrate on said optical axis and downstream of said projection objective;

placing a light sensitive substrate on said second carrier system;

selecting said mask to have a predetermined pattern;

imaging said pattern onto said light sensitive substrate; and, exposing said light sensitive substrate utilizing said microlithographic projection exposure arrangement and said mask thereof to structure said substrate.

* * * * *

UNITED STATES PATENT AND TRADEMARK OFFICE
CERTIFICATE OF CORRECTION

PATENT NO. : 6,583,937 B1
DATED : June 24, 2003
INVENTOR(S) : Johannes Wangler and Jess Koehler It is certified that error appears in the above-identified patent and that said Letters Patent is hereby corrected as shown below:

Column 11,
Line 35, delete "mastering" and substitute -- rastering -- therefor.

Column 15,
Line 57, delete "master-" and substitute -- raster- -- therefor.

Column 19,
Line 13, delete "by" and substitute -- $\delta_y$ -- therefor.

Signed and Sealed this

Twenty-seventh Day of January, 2004

JON W. DUDAS
*Acting Director of the United States Patent and Trademark Office*